US012757607B2

(12) United States Patent
Seo

(10) Patent No.: US 12,757,607 B2
(45) Date of Patent: Oct. 6, 2026

(54) COLOR FILTER FILM AND DISPLAY DEVICE INCLUDING THE SAME

(71) Applicant: LG Display Co., Ltd., Seoul (KR)

(72) Inventor: Miyeon Seo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 450 days.

(21) Appl. No.: 18/371,261

(22) Filed: Sep. 21, 2023

(65) Prior Publication Data

US 2024/0260375 A1 Aug. 1, 2024

(30) Foreign Application Priority Data

Jan. 31, 2023 (KR) ........................ 10-2023-0012558

(51) Int. Cl.

*H10K 59/38* (2023.01)
*H10K 59/40* (2023.01)
*H10K 59/80* (2023.01)
*H10K 77/10* (2023.01)
*G02B 5/20* (2006.01)
*H10K 102/00* (2023.01)

(52) U.S. Cl.

CPC ............ *H10K 59/38* (2023.02); *H10K 59/40* (2023.02); *H10K 59/873* (2023.02); *H10K 59/8792* (2023.02); *H10K 77/111* (2023.02); *G02B 5/201* (2013.01); *H10K 2102/311* (2023.02)

(58) Field of Classification Search

CPC ...... H10K 59/38; H10K 59/40; H10K 59/873; H10K 59/8792; H10K 77/111
USPC .................................................. 313/498–512
See application file for complete search history.

(56) References Cited

U.S. PATENT DOCUMENTS

2007/0026324 A1 2/2007 Yoshida et al.
2019/0373719 A1 12/2019 Lee et al.
2021/0055819 A1* 2/2021 Jun ........................ G06F 3/0416
2021/0200365 A1* 7/2021 Lee ........................ H10K 59/40
2022/0254837 A1* 8/2022 Yang ..................... G06F 3/0445

FOREIGN PATENT DOCUMENTS

KR 10-2007-0014981 A 2/2007
KR 10-2017-0113821 A 10/2017
KR 10-2018-0065735 A 6/2018
KR 10-2019-0137976 A 12/2019
KR 10-2021-0083606 A 7/2021

* cited by examiner

*Primary Examiner* — Christopher M Raabe

(74) *Attorney, Agent, or Firm* — Birch, Stewart, Kolasch & Birch, LLP

(57) ABSTRACT

A color filter film and a display apparatus including the same are provided. The display device can include a foldable display panel including a bending region bent in a curved shape, a color filter film on the foldable display panel, and a cover member on the foldable display panel. The color filter film can include a first protection layer on the foldable display panel, a color filter layer on the first protection layer, a black matrix dividing the color filter layer, and a second protection layer on the color filter layer and the black matrix.

20 Claims, 12 Drawing Sheets

600 : 610, 620, 630, 640

600 : 610, 620, 630, 640, 650

600 : 610, 620, 630, 640, 660

COLOR FILTER FILM AND DISPLAY DEVICE INCLUDING THE SAME

CROSS-REFERENCE TO RELATED APPLICATIONS

This application claims priority to Korean Patent Application No. 10-2023-0012558, filed in the Republic of Korea on Jan. 31, 2023, the entire contents of which are hereby expressly incorporated by reference into the present application.

BACKGROUND

Field

The present disclosure relates to a color filter film and a display device including the same.

Discussion of the Related Art

Display devices are being widely used as a display screen for various products, such as televisions (TVs), notebook computers, and monitors, as well as portable electronic devices such as mobile communication terminals, e-books, electronic organizers, portable multimedia players (PMPs), navigation devices, ultra mobile personal computers (PCs), mobile phones, smartphones, tablet PCs, and watch phones.

In display devices, organic light emitting display devices and electrophoretic display devices can be manufactured to be thin, and accordingly, research and development for implementing the display devices as foldable display devices are being done.

In the foldable display devices, lines and a display unit including a thin film transistor are formed on a flexible substrate having flexibility like plastic and it is possible to display an image even when being bent like paper. Thus, the foldable display devices can be applied to various display fields and provide useful features.

SUMMARY OF THE DISCLOSURE

An aspect of the present disclosure is directed to providing a color filter film and a display device including the same, in which a tensile strain can be reduced, thereby preventing or minimizing a crack or an interlayer stripping phenomenon from occurring in the display device.

The objects of the present disclosure are not limited to the aforesaid, but other objects not described herein will be clearly understood by those skilled in the art from descriptions below.

To achieve these and other aspects of the inventive concepts, as embodied and broadly described herein, a color filter film can include a first protection layer, a color filter layer on the first protection layer, a black matrix dividing the color filter layer, and a second protection layer on the color filter layer and the black matrix.

In another aspect of the present disclosure, a display device comprises a foldable display panel including a bending region bent in a curved shape, a color filter film on the foldable display panel, and a cover member on the foldable display panel, wherein the color filter film comprises a first protection layer on the foldable display panel, a color filter layer on the first protection layer, a black matrix dividing the color filter layer, and a second protection layer on the color filter layer and the black matrix.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

In an embodiment of the present disclosure, because a color filter film is separately manufactured, process stability and an interface adhesive force can be enhanced, and a yield rate can be enhanced.

In an embodiment of the present disclosure, because a color filter film is separately manufactured, a color filter film can be easily provided on a layer needing a color filter at an upper portion of a foldable display panel.

In an embodiment of the present disclosure, a tensile strain can decrease in an interlayer interface of a display device, thereby preventing or minimizing a crack or an interlayer stripping phenomenon from occurring in the display device.

In a display device according to an embodiment of the present disclosure, because a crack or an interlayer stripping phenomenon is prevented or minimized from occurring in the display device, the efficiency of the display device can be enhanced and a lifetime can be improved. As such, power consumption can be reduced and the display device can be driven with low power in an advantageous manner.

The details of the present disclosure described in technical problem, technical solution, and advantageous effects do not specify essential features of claims, and thus, the scope of claims is not limited by the details described in detailed description of the invention.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
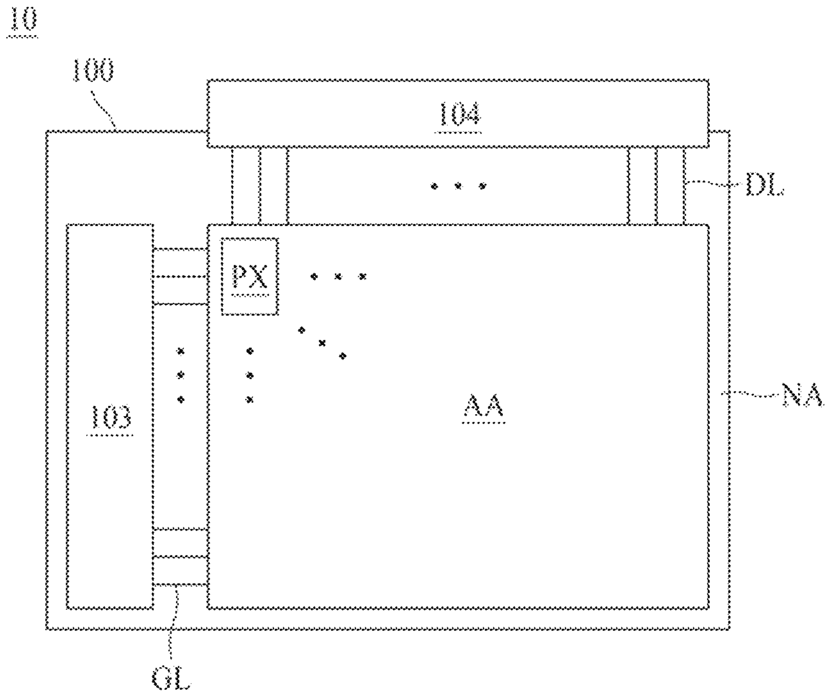
FIG. 1 is a diagram schematically illustrating a display device according to an embodiment of the present disclosure.

Reference is now be made in detail to embodiments of the present disclosure, examples of which can be illustrated in the accompanying drawings. In the following description, when a detailed description of well-known functions or configurations can unnecessarily obscure aspects of the present disclosure, the detailed description thereof can be omitted for brevity. The progression of processing steps and/or operations described is an example; however, the sequence of steps and/or operations is not limited to that set forth herein and can be changed, with the exception of steps and/or operations necessarily occurring in a particular order.

Unless stated otherwise, like reference numerals can refer to like elements throughout even when they are shown in different drawings. In one or more aspects, identical elements (or elements with identical names) in different drawings can have the same or substantially the same functions and properties unless stated otherwise. Names of the respective elements used in the following explanations are selected only for convenience and can be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The shapes, sizes, areas, ratios, angles, numbers, and the like disclosed in the drawings for describing embodiments of the present disclosure are merely examples, and thus, the present disclosure is not limited to the illustrated details.

When the term “comprise,” “have,” “include,” “contain,” “constitute,” “make up of,” “formed of,” or the like is used, one or more other elements can be added unless a term such as “only” or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form can include plural forms unless the context clearly indicates otherwise. The word “exemplary” is used to mean serving as an example or illustration. Embodiments are example embodiments. Aspects are example aspects. Any implementation described herein as an “example” is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range can be caused by various factors (e.g., process factors, internal or external impact, noise, or the like). Further, the term “may” encompasses all the meanings of the term “can.”

In describing a positional relationship, where the positional relationship between two parts is described, for example, using “on,” “over,” “under,” “above,” “below,” “beneath,” “near,” “close to,” or “adjacent to,” “beside,” “next to,” or the like, one or more other parts can be located between the two parts unless a more limiting term, such as “immediate(ly),” “direct(ly),” or “close(ly),” is used. For example, when a structure is described as being positioned “on,” “over,” “under,” “above,” “below,” “beneath,” “near,” “close to,” or “adjacent to,” “beside,” or “next to” another structure, this description should be construed as including a case in which the structures contact each other as well as a case in which one or more additional structures are disposed or interposed therebetween. Furthermore, the terms “front,” “rear,” “back,” “left,” “right,” “top,” “bottom,” “downward,” “upward,” “upper,” “lower,” “up,” “down,” “column,” “row,” “vertical,” “horizontal,” and the like refer to an arbitrary frame of reference.

In describing a temporal relationship, when the temporal order is described as, for example, “after,” “subsequent,” “next,” “before,” “preceding,” “prior to,” or the like, a case that is not consecutive or not sequential can be included unless a more limiting term, such as “just,” “immediate(ly),” or “direct(ly),” is used.

It is understood that, although the term “first,” “second,” or the like can be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like can be arbitrarily named according to the convenience of those skilled in the art without departing from the scope of the present disclosure. The terms “first,” “second,” and the like can be used to distinguish components from each other, but the functions or structures of the components are not limited by ordinal numbers or component names in front of the components.

In describing elements of the present disclosure, the terms “first,” “second,” “A,” “B,” “(a),” “(b),” or the like can be used. These terms are intended to identify the corresponding element(s) from the other element(s), and these are not used to define the essence, basis, order, sequence, or number of elements.

For the expression that an element or layer is "connected," "coupled," or "adhered" to another element or layer the element or layer can not only be directly connected, coupled, or adhered to another element or layer, but also be indirectly connected, coupled, or adhered to another element or layer with one or more intervening elements or layers disposed or interposed between the elements or layers, unless otherwise specified.

For the expression that an element or layer "contacts," "overlaps," or the like with another element or layer, the element or layer is able to not only directly contact, overlap, or the like with another element or layer, but also can indirectly contact, overlap, or the like with another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" can be understood as element A and/or element B.

In one or more aspects, the terms "between" and "among" can be used interchangeably simply for convenience unless stated otherwise. For example, an expression "between a plurality of elements" can be understood as among a plurality of elements. In another example, an expression "among a plurality of elements" can be understood as between a plurality of elements. In one or more examples, the number of elements can be two. In one or more examples, the number of elements can be more than two.

In one or more aspects, the phrases "each other" and "one another" can be used interchangeably simply for convenience unless stated otherwise. For example, an expression "different from each other" can be understood as being different from one another. In another example, an expression "different from one another" can be understood as being different from each other. In one or more examples, the number of elements involved in the foregoing expression can be two. In one or more examples, the number of elements involved in the foregoing expression can be more than two.

Features of various embodiments of the present disclosure can be partially or overall coupled to or combined with each other, and can be variously inter-operated, linked or driven together. The embodiments of the present disclosure can be carried out independently from each other or can be carried out together in co-dependent or related relationship. In one or more aspects, the components of each device according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

Hereinafter, embodiments of a display device according to various example embodiments of the present disclosure will be described in detail with reference to the accompanying drawings. With respect to reference numerals to elements of each of the drawings, although the same elements can be illustrated in other drawings, like reference numerals can refer to like elements unless stated otherwise. In addition, for convenience of description, a scale, dimension, size, and thickness of each of the elements illustrated in the accompanying drawings can differ from an actual scale, dimension, size, and thickness, and thus, embodiments of the present disclosure are not limited to a scale, dimension, size, and thickness illustrated in the drawings. Furthermore, all the components of each display device according to all embodiments of the present disclosure are operatively coupled and configured.

FIG. 1 is a diagram schematically illustrating a display device according to an embodiment of the present disclosure.

Referring to FIG. 1, a display device 10 according to an embodiment of the present disclosure can include a foldable display panel 100. The foldable display panel 100 can include a display area (active area) AA where a plurality of subpixels PX are provided and a non-display area (non-active area) NA disposed at a periphery of the display area AA.

Each of the subpixels PX of the display area AA can include a thin film transistor (TFT) which uses an oxide semiconductor material as an active layer.

A plurality of data lines DL and a plurality of gate lines GL can be provided in the display area AA. For example, the plurality of data lines DL can be arranged in rows or columns, and the plurality of gate lines GL can be arranged in rows or columns. Further, the subpixel PX can be disposed in a region defined by the data line DL and the gate line GL.

The plurality of gate lines GL can include a plurality of scan lines and a plurality of emission control lines. The plurality of scan lines and the plurality of emission control lines can be lines which transfer different kinds of gate signals (for example, a scan signal and an emission control signal) to gate nodes of different kinds of transistors (for example, a scan transistor and an emission control transistor) disposed in the subpixel PX.

At least one of a data driver 104 and a gate driver 103 can be disposed in the non-display area NA.

The gate driver 103 can include a TFT which is directly formed on a substrate of the foldable display panel 100. For example, the gate driver 103 can include a TFT including a polycrystalline silicon semiconductor layer, a TFT including an oxide semiconductor layer, or the TFT including the polycrystalline silicon semiconductor layer and the TFT including the oxide semiconductor layer. In a case where TFTs respectively disposed in the non-display area NA and the display area AA includes the same semiconductor material, the TFTs respectively disposed in the non-display area NA and the display area AA can be simultaneously performed in the same process.

In the TFT including the polycrystalline silicon semiconductor layer and the TFT including the oxide semiconductor layer, electron mobility can be high in a channel, and thus, a high resolution and low power can be implemented.

The gate driver 103 can supply a scan signal having a gate-on voltage to the plurality of gate lines GL sequentially or in a predetermined order, and thus, can drive pixel rows of the display area AA sequentially or in a predetermined order. Here, the gate driver 103 can be referred to as a scan driver. Here, the pixel row can denote a row which is configured with pixels connected to one gate line. As in the display device according to an embodiment of the present disclosure, the gate driver 103 can be implemented as a gate in panel (GIP) type and can be directly disposed on the substrate 110. The gate driver 103 can include a shift register and a level shifter.

The gate driver 103 can include a scan driving circuit which outputs scan signals to a plurality of scan lines corresponding to one kind of the gate line GL and an emission driving circuit which outputs emission control signals to the plurality of emission control lines corresponding to the other kind of the gate line GL.

The display device 10 according to an embodiment of the present disclosure can further include the data driver 104. The data driver 104 can convert image data into analog data voltages, and when a specific gate line is driven by the gate driver 103, the data driver 104 can supply the data voltages to the plurality of data lines DL. The data lines DL can be connected with the data driver 104 through a data pad.

Figure 2:
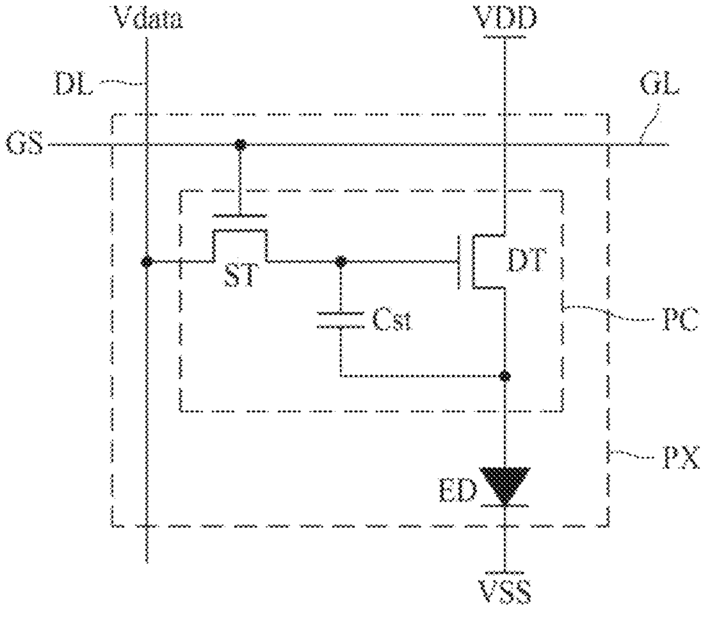
FIG. 2 is an equivalent circuit diagram illustrating an example of a pixel illustrated in FIG. 1.

FIG. 2 is an equivalent circuit diagram illustrating one example of a pixel illustrated in FIG. 1.

Referring to FIG. 2, each subpixel PX of the display device 10 according to an example of the present disclosure can include a pixel circuit PC and a light emitting device ED.

The pixel circuit PC can be provided in a circuit region of a pixel area defined by a gate line GL and a data line DL and can be connected with an adjacent gate line GL, an adjacent data line DL, and a first driving power source VDD. The pixel circuit PC can control the emission of light from the light emitting device ED with a data voltage Vdata from the data line DL in response to a gate-on signal GS from the gate line GL. The pixel circuit PC according to an embodiment can include a switching TFT ST, a driving TFT DT, and a capacitor Cst.

The switching TFT ST can include a gate electrode connected with the gate line GL, a first source/drain electrode connected with the data line DL, and a second source/drain electrode connected with a gate electrode of the driving TFT DT. The switching TFT ST can be turned on based on the gate-on signal GS supplied through the gate line GL and can supply the data voltage Vdata, supplied through the data line DL, to the gate electrode of the driving TFT DT.

The driving TFT DT can include a gate electrode connected with the second source/drain electrode of the switching TFT ST, a first source/drain electrode (or a drain electrode) connected with the first driving power source VDD, and a second source/drain electrode (or a source electrode) connected with the light emitting device ED. The driving TFT DT can be turned on with a gate-source voltage based on the data voltage Vdata supplied from the switching TFT ST and can control a data signal supplied from the first driving power source VDD to the light emitting device ED.

The capacitor Cst can be connected between the gate electrode and the source electrode of the driving TFT DT, can store a voltage corresponding to the data voltage Vdata supplied to the gate electrode of the driving TFT DT, and can turn on the driving TFT DT with the stored voltage. At this time, the capacitor Cst can maintain the turn-on state of the driving TFT DT until the data voltage Vdata is supplied thereto through the switching TFT ST in a next frame.

For example, when the display device according to an embodiment of the present disclosure is a compact model, the display device can further include a sensing transistor, an emission control transistor, and an initialization transistor. However, embodiments of the present disclosure are not limited thereto and transistors included in the display device can be variously configured based on the desired spec.

The light emitting device ED can be provided in an emission region of the pixel area and can emit light, based on a data signal supplied from the pixel circuit PC. For example, the light emitting device ED can include a first electrode connected with the source electrode of the driving TFT DT, a second electrode connected with a second driving power source VSS, and an emission layer provided between the first electrode and the second electrode. Here, the emission layer can include one of an organic emission layer, an inorganic emission layer, and a quantum dot emission layer, or can include a stack or combination structure of an organic emission layer (or an inorganic emission layer) and a quantum dot emission layer.

As described above, each subpixel PX of the light emitting display device according to an embodiment of the present disclosure can control the data signal supplied to the light emitting device ED with a gate-source voltage of the driving TFT DT based on the data voltage Vdata to allow the light emitting device ED to emit light, thereby displaying a certain image.

Figure 3:
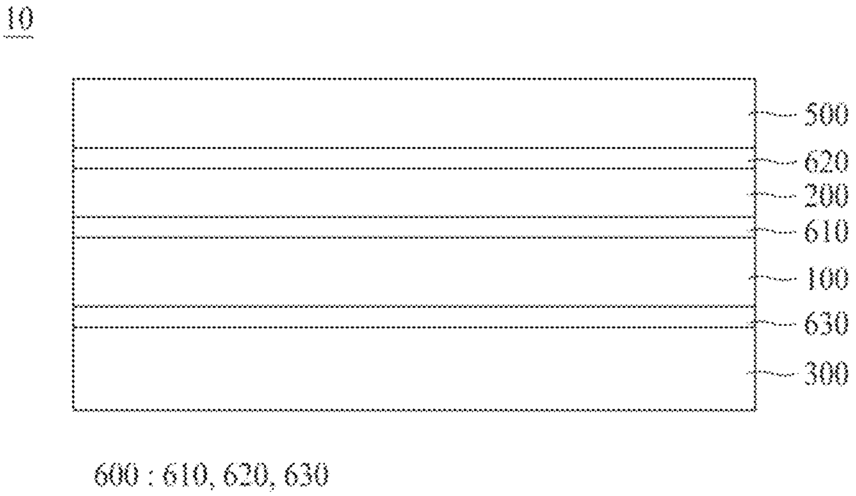
FIG. 3 is a cross-sectional view schematically illustrating a display device according to an embodiment of the present disclosure.

FIG. 3 is a cross-sectional view schematically illustrating a display device according to an embodiment of the present disclosure.

Referring to FIG. 3, the display device 10 according to an embodiment of the present disclosure can include a foldable display panel 100, a color filter film 200, a supporting plate 300, a cover member 500, and an adhesive member 600.

The foldable display panel 100 can display images. The foldable display panel 100 can be provided on the supporting plate 300. The foldable display panel 100 can include a plurality of gate lines, a plurality of data lines, and a plurality of pixels (Pixel) respectively provided in intersection areas between the plurality of gate lines and the plurality of data lines.

The foldable display panel 100 according to an embodiment of the present disclosure can include an array substrate including a TFT which is an element for selectively applying a voltage to each pixel, an organic light emitting diode (OLED) layer on the array substrate, an encapsulation layer which is disposed on the array substrate to cover the OLED layer, and a touch sensing layer provided on the encapsulation layer. The foldable display panel 100 will be described below in detail with reference to the following drawings.

The color filter film 200 can be provided on the foldable display panel 100. For example, the color filter film 200 according to an embodiment of the present disclosure can be manufactured as a film type and can be attached on an upper surface of the foldable display panel 100 by a first adhesive member 610. For example, the color filter film 200 can be separately manufactured. For example, the color filter film 200 can be manufactured by removing a dummy substrate after a first protection layer, a black matrix, a color filter layer, and a second protection layer are sequentially stacked on the dummy substrate.

Accordingly, because the color filter film 200 according to an embodiment of the present disclosure is separately manufactured, process stability, an interface adhesive force, and a yield rate can be enhanced.

Moreover, because the color filter film 200 is separately manufactured, an embodiment of the present disclosure can be variously implemented on a layer requiring a color filter on the foldable display panel 100. For example, in an embodiment of the present disclosure, because the color filter film 200 is separately manufactured, the color filter film 200 can be easily disposed between the foldable display panel 100 configuring the display device and various elements for enhancing the performance of the foldable display panel 100, based on requirements of users. The color filter film 200 will be described below in detail with reference to the following drawings.

The supporting plate 300 can be provided under the foldable display panel 100. The supporting plate 300 can support the foldable display panel 100. The supporting plate 300 can be attached on a rear surface of the foldable display panel 100 by a third adhesive member 630 to support the foldable display panel 100, and thus, can maintain the foldable display panel 100 in a flat state. The supporting plate 300 can include a foldable plastic material. For example, the supporting plate 300 can include polyethyleneterephthalate (PET), polyimide (PI), or polyurethanes (PU) and can be better than a case which includes polyethyleneterephthalate (PET).

A polarization film can be additionally provided on the color filter film 200. However, embodiments of the present disclosure are not limited thereto and the polarization film can be provided or not, based on a characteristic of the display device 10. For example, in a case where the polarization film is additionally provided, the polarization film can be attached on an upper surface of the color filter film 200 and can polarize light which is discharged from the foldable display panel 100 and passes through the color filter film 200. Further, the polarization film can compensate for an optical characteristic of the foldable display panel 100 such as the reflection of external light. For example, the polarization film can have a thickness which is thicker than the supporting plate, but embodiments of the present disclosure are not limited thereto.

The cover member 500 can be provided on the color filter film 200. The cover member 500 can be attached on the upper surface of the color filter film 200 by using a second adhesive member 620. The cover member 500 can discharge light, passing through the foldable display panel 100 and the color filter film 200, to the outside and can protect the foldable display panel 100 and the color filter film 200 from an external impact. For example, the cover member 500 can have a thickness which is thinner than the supporting plate 300, but embodiments of the present disclosure are not limited thereto. For example, the cover member 500 can include a flexible film or a tempered glass.

The adhesive member 600 can include the first adhesive member 610, the second adhesive member 620, and the third adhesive member 630. For example, the adhesive member 600 can further include additional adhesive member(s).

The first adhesive member 610 can be provided between the foldable display panel 100 and the color filter film 200 and can attach the foldable display panel 100 on the color filter film 200. The first adhesive member 610 can attach an upper surface of the foldable display panel 100 on a lower surface of the color filter film 200. Further, the first adhesive member 610 can be provided between the foldable display panel 100 and the color filter film 200 to decrease a tensile strain in an interlayer interface of the display device 10, and thus, can prevent a crack or an interlayer stripping phenomenon from occurring in the display device. For example, the first adhesive member 610 can include one of a pressure sensitive adhesive (PSA), an optical clear adhesive (OCA), an optical curable resin (OCR), or an ultraviolet (UV) resin. As another example, the first adhesive member 610 can be a semitransparent adhesive layer having a transmittance of about 80% or more.

The second adhesive member 620 can be provided between the color filter film 200 and the cover member 500 and can attach the color filter film 200 on the cover member 500. The second adhesive member 620 can attach an upper surface of the color filter film 200 on a lower surface of the cover member 500. Further, the second adhesive member 620 can be provided between the color filter film 200 and the cover member 500 to decrease a tensile strain in the interlayer interface of the display device 10, and thus, can prevent a crack or an interlayer stripping phenomenon from occurring in the display device. For example, the second adhesive member 620 can be a transparent adhesive layer. As another example, the second adhesive member 620 can be a semitransparent adhesive layer having a transmittance of about 80% or more.

The third adhesive member 630 can be provided between the supporting plate 300 and the foldable display panel 100 and can attach the supporting plate 300 on the foldable display panel 100. The third adhesive member 630 can attach an upper surface of the supporting plate 300 on a lower surface of the foldable display panel 100. For example, the third adhesive member 630 can be a transparent adhesive layer which is the same as the first adhesive member 610. For example, the third adhesive member 630 can include the same material as that of the first adhesive member 610, but embodiments of the present disclosure are not limited thereto. As another example, the third adhesive member 630 can be one of a semitransparent adhesive layer and an opaque adhesive layer.

Therefore, in an embodiment of the present disclosure, the color filter film 200 can be manufactured separately from the foldable display panel 100, attached on the foldable display panel 100 by using the first adhesive member 610, and attached on the cover member 500 by using the second adhesive member 620, and thus, can decrease a tensile strain in folding and can prevent a crack or an interlayer stripping phenomenon from occurring in the display device. Further, in an embodiment of the present disclosure, the second protection layer and the first protection layer can be respectively provided on an uppermost surface and a lowermost surface of the color filter film 200, and thus, can protect the color filter film 200, decrease a tensile strain, and prevent a crack or an interlayer stripping phenomenon from occurring in the display device.

Figure 4:
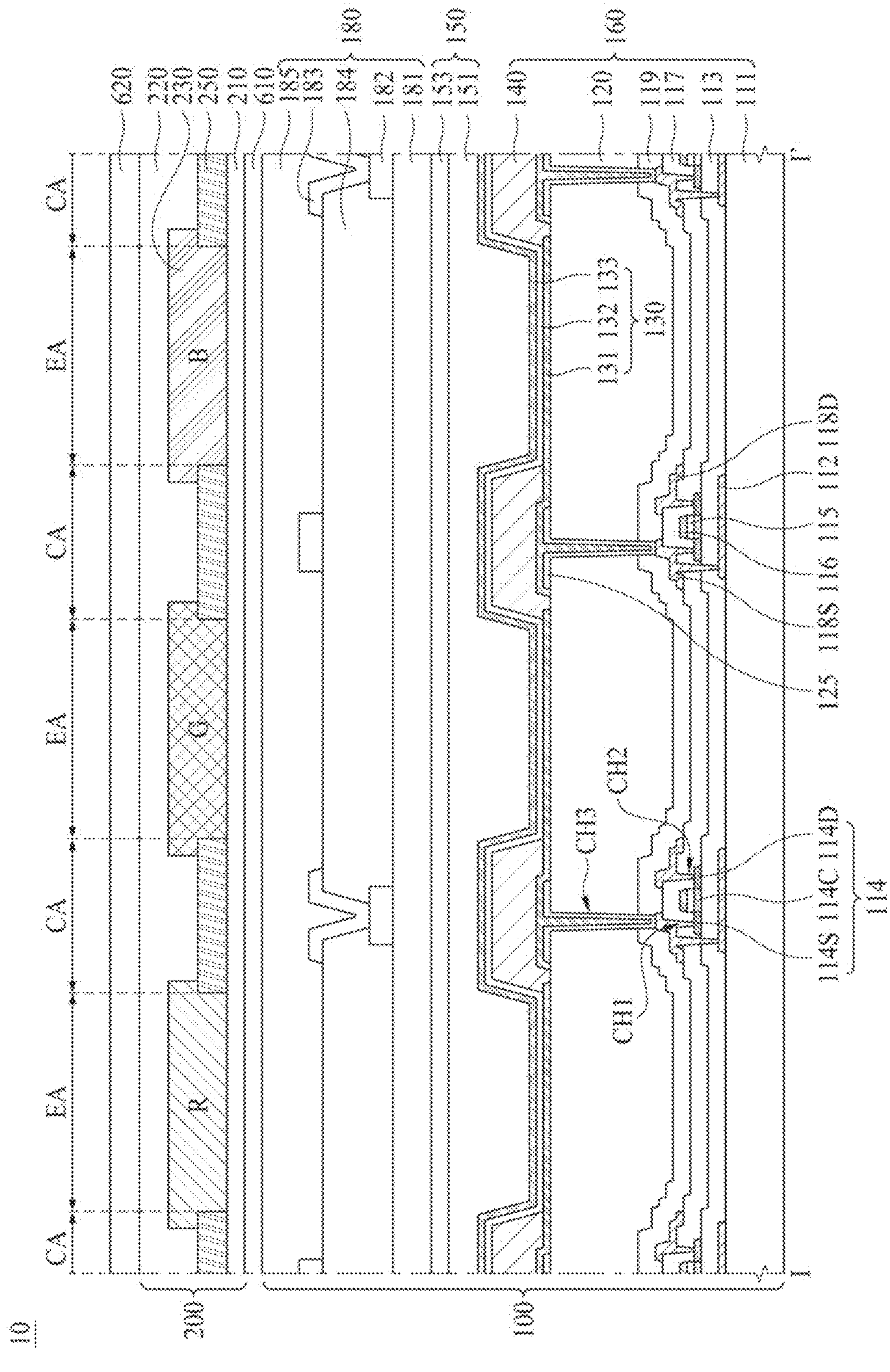
FIG. 4 is a cross-sectional view illustrating a structure of a pixel of a display device according to an embodiment of the present disclosure.
Figure 5:
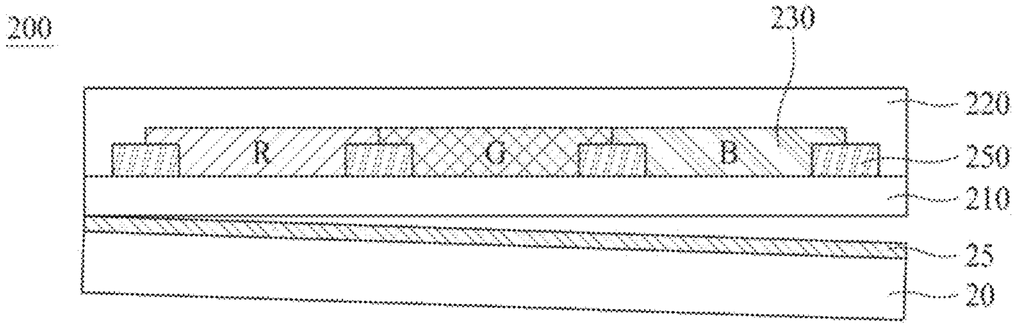
FIG. 5 is a cross-sectional view illustrating a color filter film according to an embodiment of the present disclosure.

FIG. 4 is a cross-sectional view illustrating a structure of a pixel of a display device according to an embodiment of the present disclosure. Particularly, FIG. 4 illustrates the foldable display panel 100 and the color filter film 200 illustrated in FIG. 3. Further, FIG. 5 is a cross-sectional view illustrating a color filter film according to an embodiment of the present disclosure, and illustrates the color filter film 200 illustrated in FIG. 4. Therefore, in the following descriptions, repeated descriptions are omitted or may be briefly discussed, and different elements will be described.

Referring to FIG. 4, a display device 10 according to an embodiment of the present disclosure can include a foldable display panel 100, a color filter film 200, a supporting plate 300, a cover member 500, and an adhesive member 600.

The foldable display panel 100 can include a pixel array layer 160 and a touch sensing portion 180, and an encapsulation layer 150. The pixel array layer 160 can include a lower substrate 111, a light blocking layer 112, a buffer layer 113, an active layer 114, a gate insulation layer 115, a gate electrode 116, a lower insulation layer 117, a source electrode 118S and a drain electrode 118D, an upper insulation layer 119, an overcoat layer 120, a light emitting device layer 130, a bank 140.

The lower substrate 111 can include a plurality of subpixels each including an emission region EA and a non-emission region CA. The lower substrate 111 can include a glass material, but is not limited thereto and can include a transparent plastic material (for example, a polyimide material) capable of being curved or bent. In a case where a plastic material is used as a material of the lower substrate 111, polyimide which is excellent in heat resistance for enduring a high temperature can be used based on that a high temperature deposition process is performed on the lower substrate 111.

The light blocking layer 112 can be provided between the lower substrate 111 and the active layer 114. The light blocking layer 112 can block light which is incident on the active layer 114 through the lower substrate 111, and thus, can minimize or prevent a threshold voltage variation of a transistor caused by external light. Optionally, the light blocking layer 112 can be electrically connected with the drain electrode 118S of a transistor to function as a lower gate electrode of a corresponding transistor, and in this case, can minimize or prevent a threshold voltage variation of a transistor caused by a bias voltage, in addition to a change in characteristic caused by light.

The buffer layer 113 can be provided on the lower substrate 111. The buffer layer 113 can cover all of an upper surface and a lateral surface of the light blocking layer 112. The buffer layer 112 can block the diffusion of a material of the lower substrate 111 to a transistor layer in performing a high temperature process in a manufacturing process of a TFT. Further, the buffer layer 113 can prevent external water or moisture from penetrating into a light emitting device. For example, the buffer layer 113 can include silicon oxide or silicon nitride. For example, the buffer layer 113 can include silicon oxide, silicon nitride, or a structure where silicon oxide and silicon nitride are alternately stacked.

The active layer 114 can be provided on the buffer layer 113. The active layer 114 can be provided in the non-emission region CA of the lower substrate 111. The active layer 114 can include a channel region 114C, and a drain region 114D and a source region 114S provided at both sides of the channel region 114C. For example, the active layer 114 can include the drain region 114D and the source region 114S, which have conductivity based on an etching gas in performing an etching process on the gate insulation layer 115, and the channel region 114C which does not have conductivity. In this case, the drain region 114D and the source region 114S can be disposed apart from each other in parallel with the channel region 114C therebetween. For example, the active layer 114 can include a semiconductor material consisting of one of amorphous silicon, polycrystalline silicon, oxide, and an organic material.

The gate insulation layer 115 can be provided on the channel region 114C of the active layer 114. The gate insulation layer 115 can be formed in an island shape on only the channel region 114C of the active layer 114 and can be formed on a whole front surface of the buffer layer 113 or the lower substrate 111 including the active layer 114.

The gate electrode 116 can be provided on the gate insulation layer 115 to overlap the channel region 114C of the active layer 114. The gate electrode 116 can function as a mask which allows the channel region 114C of the active layer 114 not to have conductivity caused by an etching gas in performing a patterning process of the gate insulation layer 115 by using an etching process. For example, the gate electrode 116 can include molybdenum (Mo), aluminum (Al), chromium (Cr), gold (Au), titanium (Ti), nickel (Ni), neodymium (Nd), copper (Cu), or an alloy thereof and can include a single layer or a two or more-layer multilayer, which includes the metal or alloy.

The lower insulation layer 117 can be provided on the lower substrate 111. The lower insulation layer 117 can be provided on the buffer layer 113 to cover the gate electrode 116. The lower insulation layer 117 can be provided on the gate electrode 116 and the drain region 114D and source drain region 114S of the active layer 114. For example, the lower insulation layer 117 can include an inorganic material such as silicon oxide (SiOx) or silicon nitride (SiNx). For example, the lower insulation layer 117 can include an organic material such as benzocyclobutene or photo acryl.

The source electrode 118S can be connected with the source region 114S of the active layer 114 through a first contact hole CH1 provided in the lower insulation layer 117 overlapping the source region 114S.

The drain electrode 118D can be connected with the drain region 114D of the active layer 114 through a second contact hole CH2 provided in the lower insulation layer 117 overlapping the drain region 114D of the active layer 114.

The source electrode 118S and the drain electrode 118D can include the same metal material. For example, the source electrode 118S and the drain electrode 118D can include Mo, Al, Cr, Au, Ti, Ni, Nd, Cu, or an alloy thereof and can include a single layer or a two or more-layer multilayer, which includes the metal or alloy.

Additionally, the non-emission region CA can further include a switching TFT and a capacitor. The switching TFT can be provided in the non-emission region CA to have the same structure as that of a driving TFT, and the capacitor can be provided in an overlap region between the gate electrode 116 and the source electrode 118S of the driving TFT overlapping each other with the lower insulation layer 117 therebetween.

The upper insulation layer 119 can be provided all over the lower substrate 111 to cover the TFT. For example, the upper insulation layer 119 can cover the source electrode 118S and the drain electrode 118D of the driving TFT and the lower insulation layer 117. For example, the upper insulation layer 119 can include an inorganic material such as SiOx or SiNx.

The overcoat layer 120 can be provided on the lower substrate 111. The overcoat layer 120 can be provided on the upper insulation layer 119. The overcoat layer 120 can planarize an upper surface of the lower substrate 111 including the TFT. For example, the overcoat layer 120 can include an organic layer such as polyimide or acrylic resin.

The light emitting device layer 130 can be provided on the overcoat layer 120. The light emitting device layer 130 can include a first electrode 131, an emission layer 132, and a second electrode 133.

The first electrode 131 can be provided on the overcoat layer 120. For example, the first electrode 131 can be connected with the source electrode 118S of the driving TFT through a third contact hole CH3. The third contact hole CH3 can be provided in the overcoat layer 120. For example, the first electrode 131 can be formed in a multi-layer structure which includes a transparent conductive layer and an opaque conductive layer having high reflection efficiency. The transparent conductive layer can include a material, having a relatively large work function value, such as indium-tin-oxide (ITO) or indium-zinc-oxide (IZO), and the opaque conductive layer can include a single-layer or multi-layer structure which includes Al, silver (Ag), Cu, lead (Pb), Mo, Ti, or an alloy thereof. A secondary electrode 125 can be further provided between the first electrode 131 and the overcoat layer 120. The secondary electrode can connect the first electrode 131 with the source electrode 118S.

The bank 140 can be formed on the overcoat layer 120 to cover one side and the other side of the first electrode 131 of each subpixel. The bank 130 can be a pixel definition layer which defines an emission region of each subpixel. For example, the bank 140 can include an opaque material so as to prevent light interference between adjacent subpixels. In this case, the bank 140 can include a light blocking material including at least one of a colored pigment, organic black, and carbon. The bank 140 can be disposed to correspond to a black matrix 180 of a color filter film 200 opposite thereto.

The emission layer 132 can be provided on the first electrode 131. The emission layer 132 can be formed by stacking a hole injection/transport layer, an organic emission layer, and an electron injection/transport layer in order or in reverse order.

The second electrode 133 can be opposite to the first electrode 131 with the emission layer 132 therebetween and can be provided on an upper surface and a lateral surface of the emission layer 132. The second electrode 133 can be provided as one body in a whole surface of an active region. For example, in a case where the second electrode 133 is applied to an organic light emitting display device of a top emission type, the second electrode 133 can include a transparent conductive layer such as ITO or IZO.

The encapsulation layer 150 can be provided on the second electrode 133, so as to prevent the penetration of water into each pixel. The encapsulation layer 150 can cover the second electrode 133. The encapsulation layer 150 can include an organic material layer 151 and an inorganic material layer 153. However, embodiments of the present disclosure are not limited thereto, and the encapsulation layer 150 can be formed in a multi-layer structure where the organic material layer 151 and the inorganic material layer 153 are alternately stacked. For example, the organic material layer 151 can include one of acrylic resin, epoxy resin, siloxane resin, polyimide resin, and polyamide resin. For example, the inorganic material layer 153 can include one of silicon nitride, silicon oxide, silicon oxynitride, and aluminum oxide.

The touch sensing portion 180 can be provided on the encapsulation layer 150 to detect a touch position of a user touch. The touch sensing portion 180 can be directly formed on an upper surface of the encapsulation layer 150, or can be separately manufactured and can be attached thereon. Hereinafter, an embodiment of the present disclosure will be described as an example where the touch sensing portion 180 is directly formed on the upper surface of the encapsulation layer 150.

The touch sensing portion 180 can include a touch buffer layer 181, a bridge electrode 182, a touch insulation layer 184, a touch electrode 183, and a touch protection layer 185.

The touch buffer layer 181 can be provided on the encapsulation layer 150. The touch buffer layer 181 can be provided on the inorganic material layer 153. For example, the touch buffer layer 181 can include one of silicon nitride, silicon oxide, silicon oxynitride, and aluminum oxide.

The bridge electrode 182 can be provided on the touch buffer layer 181 and can be connected with the touch electrode 183. For example, the bridge electrode 182 can be formed in a single-layer or multi-layer structure including an opaque metal material which is strong in corrosion resistance and acid resistance and is good in conductivity. For example, the bridge electrode 182 can be formed in a single-layer or multi-layer structure including one or more of Mo, Al, Cr, Au, Ti, Ni, Cu, Nd, tungsten (W), and an alloy thereof. For example, the bridge electrode 182 can be formed in a stack structure of three metal layers such as Ti/Al/Ti, Mo/Al/Mo, MoTi/Cu/MoTi, or Ti/Al/Mo.

The touch insulation layer 184 can be provided on the touch buffer layer 181. The touch insulation layer 184 can include the same inorganic insulating material as that of the touch buffer layer 181, but embodiments of the present disclosure are not limited thereto.

The touch electrode 183 can be provided on the touch insulation layer 184. The touch electrode 183 can be connected with the bridge electrode 182 through a contact hole provided in the touch insulation layer 184. The touch electrode 183 can include the same material as that of the bridge electrode 182.

The touch protection layer 185 can be provided on the touch electrode 183 and the touch insulation layer 184. The touch protection layer 185 can cover the touch electrode 183 and the touch insulation layer 184. The touch protection layer 185 can planarize an upper surface of the touch sensing portion 180. The touch protection layer 185 can provide a flat surface on the color filter film 200 provided on the touch protection layer 185. For example, the touch protection layer 185 can include a photo-curable organic insulating material which is one of an acrylic material, a polyimide material, and a siloxane material.

Referring to FIGS. 4 and 5, the color filter film 200 can be provided on the foldable display panel 100. The color filter film 200 can be attached on the foldable display panel 100 by using the first adhesive member 610. The color filter film 200 can be provided on the touch protection layer 185. The color filter film 200 can be attached on the touch protection layer 185 by using the first adhesive layer 610. The color filter film 200 according to an embodiment of the present disclosure can be manufactured by using a separate process, and then, can be attached on the foldable display panel 100.

Referring to FIG. 5, an inorganic layer 25, a first protection layer 210, a black matrix 250, a color filter layer 230, and a second protection layer 220 can be sequentially stacked on a dummy substrate 20, and then, the dummy substrate 20 and the inorganic layer 25 can be detached from the first protection layer 210, thereby manufacturing the color filter film 200 according to an embodiment of the present disclosure. The color filter film 200 detached from the dummy substrate 20 and the inorganic layer 25 can be attached on an upper surface of the foldable display panel 100 by using the first adhesive member 610. Therefore, the color filter film 200 can be provided on the foldable display panel 100. Accordingly, the color filter film 200 can include the first protection layer 210, the color filter layer 230, the black matrix 250, and the second protection layer 220.

The first protection layer 210 can be provided on the foldable display panel 100. The first protection layer 210 can be attached on the foldable display panel 100 by using the first adhesive member 610. The first protection layer 210 can be attached on the touch protection layer 185 by using the first adhesive member 610. For example, a thickness of the first protection layer 210 can be about 10 μm or less. For example, the first protection layer 210 can include a material such as photoacryl (PAC), silicon-based elastomer, or thermal poly-urethane (TPU or thermoplastic polyurethane). For example, the first protection layer 210 can include one or more of proparhyl methacrylate, glycidyl methacrylate, pentafluorophenyl methacrylate, dimethylaminoethyl methacrylate, dimethylaminomethylstyrene, furfuryl methacrylate, poly(styrene-alt-maleic anhydride, N-siopropylacrylamide (NIPAM), allylamine, acrylic acid, 2-hydroxyethyl methacrylate, trivinyltrimethylcyclotrisiloxane, cyclohexyl methacrylate, isobornyl acrylate, perfluorodecyl acrylate, vinyl pyrrrolidone, and poly(ethylene glycol) methacrylate. For example, the first protection layer 210 can include a high-purity polymer layer which is formed by using an initiated chemical vapor deposition (i-CVD) process. For example, in a case where the first protection layer 210 is formed by using the i-CVD process, various kinds of functional polymer thin films can be formed without the damage of a substrate. Further, adhesive properties corresponding to an adjacent material can increase by controlling a surface treatment effect of a thin film.

The color filter layer 230 can be provided on the first protection layer 210. The color filter layer 230 can be provided in each subpixel of the foldable display panel 100. For example, the color filter layer 230 can include a red color filter, a green color filter, and a blue color filter respectively corresponding to subpixels. In an embodiment of the present disclosure, because white light is emitted from a white light emitting device layer 130, the color filter layer 230 which is patterned can be provided for each subpixel, and thus, a color image can be implemented.

The black matrix 250 can be provided on the first protection layer 210. The black matrix 250 can divide the color filter layer 230. The black matrix 250 can be provided at a boundary between adjacent subpixels. The black matrix 250 can be provided between a plurality of color filters respectively corresponding to subpixels of the foldable display panel 100. The black matrix 250 can be provided in the non-emission region CA in each subpixel. The black matrix 250 can be provided to correspond to the bank 140 of the foldable display panel 100. The black matrix 250 can be provided to face the bank 140 of the foldable display panel 100.

For example, a width of the black matrix 250 can be set to be less than that of the bank 140. The black matrix 250 can be provided between color filters so that lights passing through color filters do not overlap each other or are not mixed. The black matrix 250 can divide an emission region of light passing through the color filter layer 230.

For example, the black matrix 250 can include an organic material including a black pigment such as black carbon. For example, the black matrix 250 can include an organic material including silicon-beads (Si-beads). For example, when the black matrix 250 includes Si-beads, a black matrix 250 material can be manufactured by mixing Si-beads with an organic solvent. For example, when the black matrix 250 includes Si-beads, the black matrix 250 can have a characteristic where a haze is about 80% or more. Accordingly, the black matrix 250 can prevent the occurrence of a color mixture in a viewing angle and can decrease a reflectance of a metal line.

The second protection layer 220 can be provided on the color filter layer 230 and the black matrix 250. The second protection layer 220 can cover the color filter layer 230 and the black matrix 250. The second protection layer 220 can cover an outermost upper surface and a lateral surface of each of the color filter layer 230 and the black matrix 250. The second protection layer 220 can contact an upper surface of each of the color filter layer 230 and the black matrix 250. For example, the second protection layer 220 can include an organic layer such as polyimide or acrylic resin.

The second adhesive member 620 can be provided on the second protection layer 220. For example, the first adhesive member 610 and the second adhesive member 620 can be respectively attached on a lower surface and an upper surface of the color filter film 200. Accordingly, in an embodiment of the present disclosure, the color filter film 200 can be easily disposed between the foldable display panel 100 configuring the display device and various members for enhancing the performance of the foldable display panel 100, and thus, a tensile strain occurring in folding can decrease, thereby reducing a defect such as a crack or interlayer interface stripping.

The first protection layer 210 and the second protection layer 220 according to an embodiment of the present disclosure can surround the color filter layer 230 and the black matrix 250. The first protection layer 210 can surround a lower surface of each of the color filter layer 230 and the black matrix 250. The second protection layer 220 can cover the upper surface and the lateral surface of each of the color filter layer 230 and the black matrix 250. In a non-display area where the color filter layer 230 and the black matrix 250 are not provided, the first protection layer 210 and the second protection layer 220 can contact each other to surround the color filter layer 230 and the black matrix 250.

The first protection layer 210 and the second protection layer 220 according to an embodiment of the present disclosure can include different materials. However, embodiments of the present disclosure are not limited thereto, and based on an interlayer structure, the first protection layer 210 and the second protection layer 220 can include the same material. For example, the first protection layer 210 and the second protection layer 220 can have different thicknesses. For example, the thicknesses of the first protection layer 210 and the second protection layer 220 can differ based on a bending direction of the display device 10. Here, the bending direction can include inner folding where the pixel array layer 160 and the color filter film 200 are disposed at an inner side and outer folding where the pixel array layer 160 and the color filter film 200 are disposed at an outer side. For example, a thickness of each of the first protection layer 210 and the second protection layer 220 can be variously set based on the bending direction (or a folding direction). For example, when the bending direction (or the folding direction) is the inner folding, a thickness of the first protection layer 210 can be thicker than that of the second protection layer 220. For example, when the bending direction (or the folding direction) is the outer folding, a thickness of the first protection layer 210 can be set to be thinner than that of the second protection layer 220. However, embodiments of the present disclosure are not limited thereto, and the first protection layer 210 and the second protection layer 220 can be variously set based on a stack structure.

The supporting plate 300 can be provided under the foldable display panel 100. The supporting plate 300 can support the foldable display panel 100.

The polarization film 400 can be provided on the color filter film 200. The polarization film 400 can be attached on an upper surface of the second protection layer 220 of the color filter film 200. The polarization film 400 can be directly attached on the second protection layer 220 of the color filter film 200 by using an adhesive which is provided on a lower surface of the polarization film 400. However, embodiments of the present disclosure are not limited thereto, and a separate adhesive layer can be provided between the polarization film 400 and the second protection layer 220 of the color filter film 200.

The first adhesive member 610 can be provided between the foldable display panel 100 and the color filter film 200 and can attach the foldable display panel 100 on the color filter film 200. The first adhesive member 610 can attach the touch protection layer 185 of the foldable display panel 100 on the first protection layer 210 of the color filter film 200. Accordingly, the first protection layer 210 and the first adhesive layer 610 can be provided between the color filter layer 230 of the color filter film 200 and the foldable display panel 100.

For example, in a case where the color filter layer is formed on the foldable display panel 100, maximum compression or maximum tension can be applied to an organic film layer of a color filter layer disposed at an uppermost portion at a neutral plane with respect to the foldable display panel 100, based on a bending direction. For example, in a case where the bending direction is the inner folding, maximum compression can be applied to the organic film layer of the color filter layer. For example, in a case where the bending direction is the outer folding, maximum tension can be applied to the organic film layer of the color filter layer. Recently, as a display device capable of 360-degree folding is developed, it is required to develop technology which decreases a bending strain in all of the inner folding and the outer folding to reduce a defect rate.

Therefore, in an embodiment of the present disclosure, the color filter film 200 can include the first protection layer 210 and the first adhesive member 610 which are attached on the foldable display panel 100, thereby decreasing a bending strain or a tensile strain of the color filter film 200. Further, in an embodiment of the present disclosure, because the color filter film 200 is separately manufactured, a thickness and a material of each of the first protection layer 210 and the second protection layer 220 of the color filter film 200 can be set based on a characteristic of an adjacent material. Accordingly, in an embodiment of the present disclosure, a tensile strain can decrease in the interlayer interface of the display device 10, thereby preventing a crack or an interlayer stripping phenomenon from occurring in the display device 10.

Moreover, in an embodiment of the present disclosure, because the color filter film 200 is separately manufactured, process stability, an interface adhesive force, and a yield rate can be enhanced.

Moreover, because the color filter film 200 is separately manufactured, an embodiment of the present disclosure can be variously implemented on a layer requiring a color filter on the foldable display panel 100. For example, in an embodiment of the present disclosure, because the color filter film 200 is separately manufactured, the color filter film 200 can be easily disposed between the foldable display panel 100 configuring the display device and various elements for enhancing the performance of the foldable display panel 100, based on requirements of users.

Moreover, in an embodiment of the present disclosure, because a crack or an interlayer stripping phenomenon is prevented from occurring in the display device 10, the efficiency of the display device 10 can be enhanced and a lifetime can be improved, and thus, power consumption can be reduced and the display device 10 can be driven with low power.

In the following descriptions, the modified elements will be described in detail, the other elements are referred to by the same reference numerals as FIGS. 3 to 5, and repeated descriptions thereof are omitted or will be briefly given.

Figure 6:
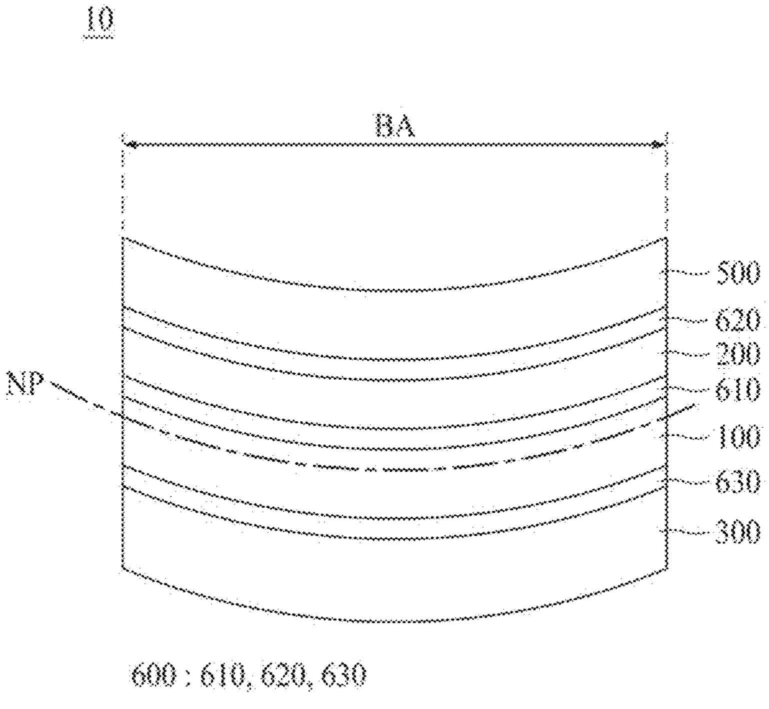
FIG. 6 is a cross-sectional view illustrating a state where the display device of FIG. 3 is folded.

FIG. 6 is a cross-sectional view illustrating a state where the display device of FIG. 3 is folded, and is a cross-sectional view illustrating a state where inner folding of the display device of FIG. 3 is performed.

Referring to FIG. 6, a bending region (bending area) BA can be bent at a certain curvature with respect to an inner center, which is bent, of the cover member 500, a compression stress can be applied to the cover member 500 disposed at the bent center, and a relatively large tensile strain can be applied to the supporting plate 300 disposed at an outermost portion from the bent center. Such a stress can be transferred to the foldable display panel 100 and the color filter film 200. For example, when a compression stress and a tensile stress are applied to the bending region BA, a neutral plane NP can be in the bending region BA, and a relatively large compression stress or tensile stress can be applied to the foldable display panel 100 in a direction distancing from the neutral plane NP. Here, the neutral plane NP can be defined as a position at which each of a compression stress and a tensile stress is 0 (zero). As described above, when a compression stress or a tensile stress is repeatedly applied to the foldable display panel 100 or a stress which is greater than a critical stress endurable by each layer is applied to the foldable display panel 100, damage or a crack can occur in a color filter layer disposed at an outermost portion of the foldable display panel 100, and an interlayer stripping phenomenon can occur therein.

Therefore, in an embodiment of the present disclosure, the color filter film 200 can be manufactured separately from the foldable display panel 100, attached on the foldable display panel 100 by using the first adhesive member 610, and attached on the cover member 500 by using the second adhesive member 620, and thus, can decrease a tensile strain in folding and can prevent a crack or an interlayer stripping phenomenon from occurring in the display device. Further, in an embodiment of the present disclosure, the second protection layer and the first protection layer can be respectively provided on an uppermost surface and a lowermost surface of the color filter film 200, and thus, can protect the color filter film 200, decrease a tensile strain, and prevent a crack or an interlayer stripping phenomenon from occurring in the display device.

Figure 7:
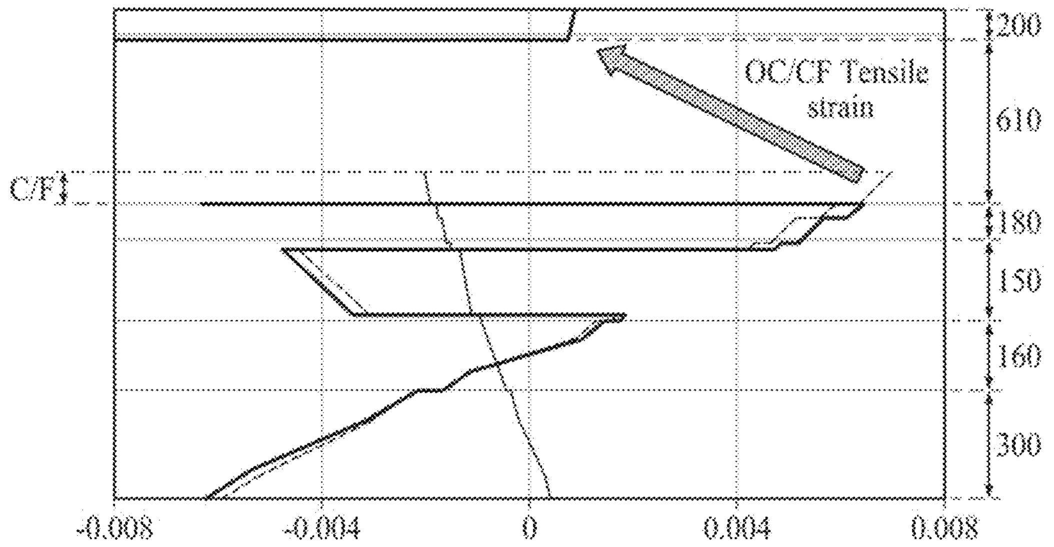
FIG. 7 is a graph showing an example of a tensile strain based on a folding of the display device of FIG. 3.

FIG. 7 is a graph showing an example of a tensile strain based on folding of the display device of FIG. 3. This illustrates a tensile strain of each of a foldable display panel and a color filter film.

The inventor of the present application has performed various experiments for decreasing a tensile strain based on folding of a display device and optimizing a process. Through the various experiments, the inventor has invented a color filter film having a new structure and a display device including the same, which can reduce a tensile strain based on folding.

The inventor has prepared samples as a comparative example 1, a comparative example 2, and an embodiment 1 so as to compare tensile strains based on folding of a display device according to an embodiment of the present disclosure.

A display device according to the comparative example 1 has been manufactured in a structure where color filter layers are sequentially stacked on a TFT substrate, instead of a configuration where a separately manufactured color filter film is attached on a foldable display panel. A bending curvature of the display device according to the comparative example 1 has been measured to be 4R, and a tensile strain of an inner portion of a bent display device has been measured. In a graph, the comparative example 1 is illustrated by a solid line.

A display device according to the comparative example 2 has been manufactured identically to the comparative example 1, a bending curvature has been measured to be 4R, and a tensile strain of an outer portion of a bent display device has been measured. In a graph, the comparative example 2 is illustrated by a dotted line.

A display device according to the embodiment 1 has a structure which includes the lower substrate 111, the pixel array layer 160, the encapsulation layer 150, the touch sensing portion 180, and the color filter film 200 according to an embodiment of the present disclosure described above with reference to FIGS. 3 to 6. The color filter film 200 can include a first protection layer provided on the touch sensing portion 180, and the first protection layer can include one material of silicon-based elastomer and TPU. A bending curvature of the display device according to the embodiment 1 has been measured to be 4R, and a tensile strain of an outer portion of a bent display device has been measured. In a graph, the embodiment 1 is illustrated by a thick solid line.

Referring to FIG. 7, in the comparative example 1, it can be seen that compression is applied to an inner portion of a display device in folding and a value of a tensile strain is not large with respect to a neutral plane.

In the comparative example 2, because an outer portion of the display device expands in folding, it can be seen that a tensile strain increases progressively while passing through the touch sensing layer 180 and a color filter layer C/F via the encapsulation layer 150. Accordingly, in the comparative example 2, it can be seen that a tensile strain is maximized in the color filter layer 200, and due to this, a crack or an interlayer stripping phenomenon occurs in the display device.

For reference, in a graph of FIG. 7, the comparative example 1 and the comparative example 2 has a configuration where the color filter layer C/F is provided on the touch sensing layer 180, instead of a configuration where the first adhesive member 610 and the color filter film 200 are provided. Therefore, in the graph, a solid line and a dotted line illustrate only up to the color filter layer C/F of each of the comparative example 1 and the comparative example 2.

It can be seen that a tensile strain of the embodiment 1 increases progressively in the touch sensing layer 180 via the encapsulation layer 150 but decreases rapidly in the first adhesive member 610, and is located at a level adjacent to a neutral plane in the color filter film 200.

Therefore, in the embodiment 1, the color filter film 200 includes the first protection layer and the second protection layer and an adhesive member for attaching the color filter film 200 is provided under the color filter film 200, and thus, it can be seen that a tensile strain is reduced. Accordingly, in the embodiment 1, it can be seen that there is an effect where a crack or an interlayer stripping phenomenon occurs in the display device.

Figure 8:
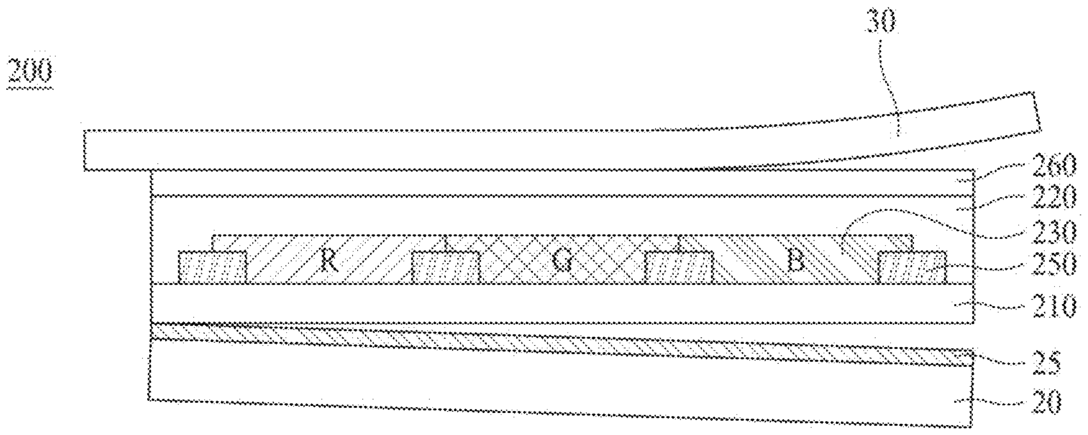
FIG. 8 is a cross-sectional view illustrating a color filter film according to another example of the present disclosure.

FIG. 8 is a cross-sectional view illustrating a color filter film according to another embodiment of the present disclosure. Except for that an adhesive layer is additionally provided, a color filter film according to another embodiment of the present disclosure can be the same as an embodiment of the present disclosure described above with reference to FIG. 5. Hereinafter, accordingly, an adhesive layer and elements relevant thereto will be described, and descriptions of the same elements are omitted or may be briefly provided.

Referring to FIG. 8, a color filter film 200 according to another embodiment of the present disclosure can further include an adhesive layer 260. The adhesive layer 260 can be provided on a second protection layer 220. For example, the color filter film 200 can be manufactured by sequentially stacking an inorganic layer 25, a first protection layer 210, a black matrix 250, a color filter layer 230, a second protection layer 220, and an adhesive layer 260 on a dummy substrate 20 and attaching an upper dummy substrate 30 on an upper surface of the adhesive layer 260. The first protection layer 210 of the color filter film 200 can be attached on the foldable display panel 100, the upper dummy substrate 30 can be detached from the adhesive layer 260, and a polarization film, a second adhesive member, and a cover member can be sequentially attached on the adhesive layer 260, thereby manufacturing the display device.

Another embodiment of the present disclosure can have the same effect as an embodiment of the present disclosure described above with reference to FIG. 5.

Moreover, in another embodiment of the present disclosure, the color filter film 200 can be separately manufactured and the adhesive layer 260 can be provided on the second protection layer 220 of the color filter film 200, and thus, the color filter film 200 can be coupled to films provided later, without a separate adhesive member in a mother or cell state.

Figure 9:
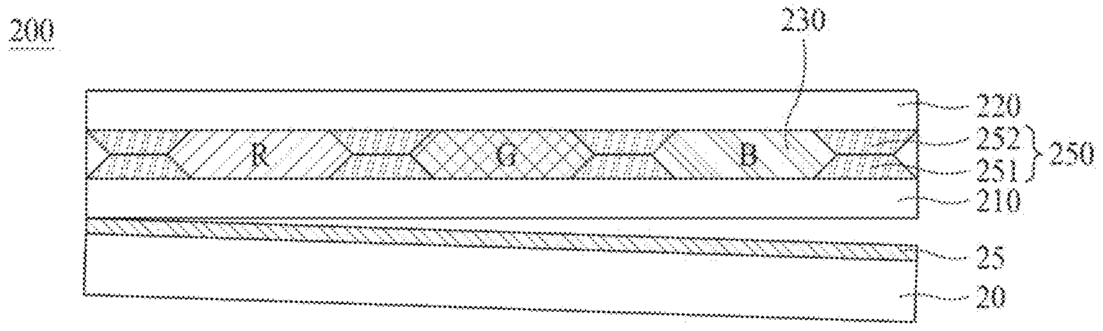
FIG. 9 is a cross-sectional view illustrating a color filter film according to another example of the present disclosure.
Figure 10:
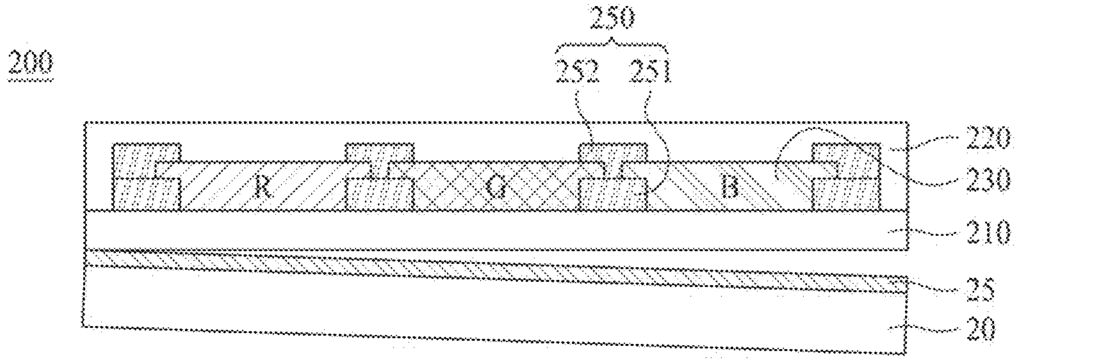
FIG. 10 is a cross-sectional view illustrating a color filter film according to another example of the present disclosure.

FIG. 9 is a cross-sectional view illustrating a color filter film according to another embodiment of the present disclosure. FIG. 10 is a cross-sectional view illustrating a color filter film according to another embodiment of the present disclosure. Except for a configuration of a black matrix, a color filter film according to another embodiment of the present disclosure can be the same as an embodiment of the present disclosure described above with reference to FIG. 5. Hereinafter, accordingly, a black matrix and elements relevant thereto will be described, and descriptions of the same elements are omitted or may be briefly provided.

Referring to FIG. 9, a black matrix 250 according to another embodiment of the present disclosure can be formed of a plurality of layers. The black matrix 250 can include a first black matrix 251 and a second black matrix 252.

The first black matrix 251 can be provided on a first protection layer 210. A width of an upper surface of the first black matrix 251 can be less than that of a lower surface thereof. A lateral surface of the first black matrix 251 can include a slope surface which is inclined in a direction from the upper surface thereof to the lower surface thereof. Accordingly, the first black matrix 251 can have a tapered shape. The second black matrix 252 can be provided on the first black matrix 251.

A lower surface of the second black matrix 252 can contact the upper surface of the first black matrix 251. A width of an upper surface of the second black matrix 252 can be greater than that of the lower surface thereof. A lateral surface of the second black matrix 252 can include a slope surface which is inclined in a direction from the upper surface thereof to the lower surface thereof. Accordingly, the first black matrix 251 can have a reverse tapered shape. The second black matrix 252 can be provided on the first black matrix 251. For example, a thickness of the second black matrix 252 can differ from that of the first black matrix 251, but embodiments of the present disclosure are not limited thereto. For example, a thickness of the black matrix 250 can be less than or equal to that of the color filter layer 230.

The color filter film 200 can be manufactured by sequentially forming an inorganic layer 25, the first protection layer 210, the first black matrix 251, the color filter layer 230, the second black matrix 252, and a second protection layer 220 on a dummy substrate 20 and detaching the dummy substrate 20 and the inorganic layer 25 from the first protection layer 210. The second black matrix 252 can be provided between two adjacent color filters of a plurality of color filters configuring the color filter layer 230 and can be configured to contact the first black matrix 252. The second protection layer 220 can be provided to cover the color filter layer 230 and the second black matrix 252. The second protection layer 220 can contact an upper surface of the color filter layer 230, an upper surface of the second black matrix 252, and a portion of a lateral surface of the second black matrix 252.

Referring to FIG. 10, a black matrix 250 according to another embodiment of the present disclosure can be formed of a plurality of layers. The black matrix 250 can include a first black matrix 251 and a second black matrix 252. The first black matrix 251 can be provided on a first protection layer 210. The second black matrix 252 can be provided on the first black matrix 251. A lower surface of the second black matrix 252 can contact an upper surface of the first black matrix 251. For example, the second black matrix 252 can cover a portion of an upper surface of a color filter layer adjacent to the second black matrix 252. For example, the second black matrix 252 can cover an end of the upper surface of the color filter layer adjacent to the second black matrix 252. For example, a width of an upper surface of the second black matrix 252 can be greater than that of the first black matrix 251, but embodiments of the present disclosure are not limited thereto. For example, a thickness of the second black matrix 252 can differ from that of the first black matrix 251, but embodiments of the present disclosure are not limited thereto.

For example, a thickness of the black matrix 250 according to another embodiment of the present disclosure can be greater than that of the color filter layer 230. For example, a sum of thicknesses of the first black matrix 251 and the second black matrix 252 can be greater than a thickness of the color filter layer 230. The color filter film 200 can be manufactured by using the same process as another embodiment of the present disclosure described above with reference to FIG. 9.

According to some embodiments of the present disclosure described above with reference to FIGS. 9 and 10, a thickness of the black matrix 250 can be equal to that of the color filter layer 230, or the black matrix 250 can have a thickness of a 30% range with respect to a thickness of the color filter layer 230. For example, when a thickness of the color filter layer 230 is 1, a thickness of the black matrix 250 can have a value within a range of about 0.7 to about 1.3.

According to some embodiments of the present disclosure, because the black matrix 250 includes a plurality of layers, the occurrence of a color mixture in a viewing angle can be better prevented, and the visibility of a display device can be improved.

Moreover, according to some embodiments of the present disclosure, a thickness of the black matrix 250 can be set to a value of a 30% range with respect to a thickness of the color filter layer 230, and thus, the black matrix 250 can be easily attached on the second protection layer 220, thereby additionally preventing the occurrence of an interlayer stripping phenomenon caused by a tensile strain.

Figure 11:
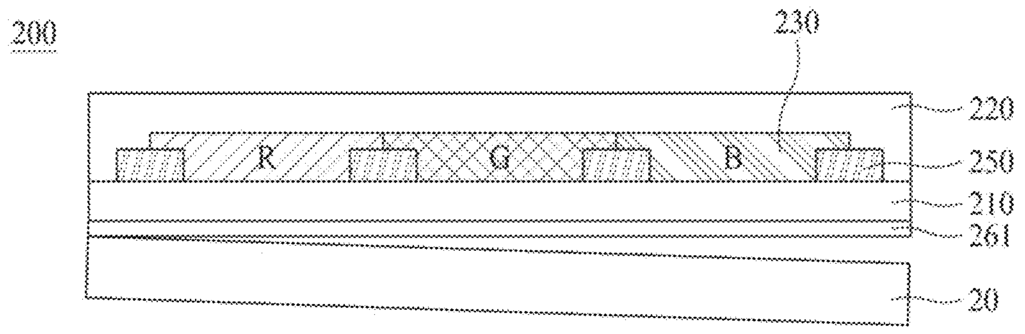
FIG. 11 is a cross-sectional view illustrating a color filter film according to another example of the present disclosure.
Figure 12:
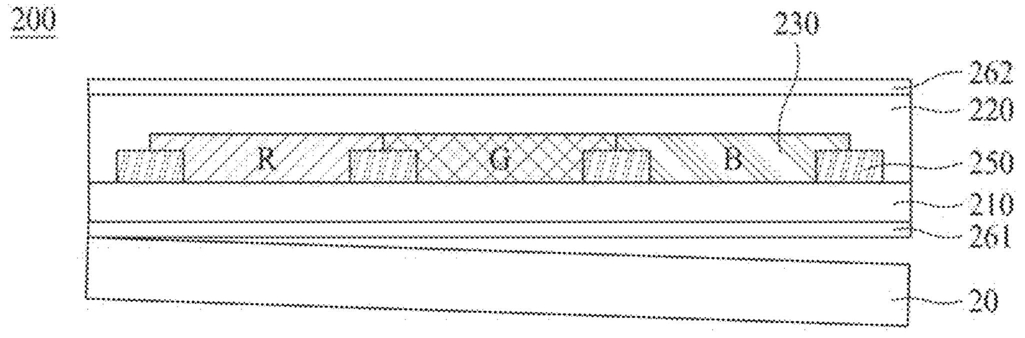
FIG. 12 is a cross-sectional view illustrating a color filter film according to another example of the present disclosure.

FIG. 11 is a cross-sectional view illustrating a color filter film according to another embodiment of the present disclosure. FIG. 12 is a cross-sectional view illustrating a color filter film according to another embodiment of the present disclosure. Except for that a first inorganic layer and/or a second inorganic layer are additionally provided, a color filter film according to another embodiment of the present disclosure can be the same as an embodiment of the present disclosure described above with reference to FIG. 5. Hereinafter, therefore, a first inorganic layer and a second inorganic layer and elements relevant thereto will be described, and repeated descriptions of the same elements are omitted or may be briefly provided.

Referring to FIG. 11, a color filter film 200 according to another embodiment of the present disclosure can further include a first inorganic layer 261. The first inorganic layer 261 can be provided under a first protection layer 210. The first inorganic layer 261 can prevent the penetration of water into the first protection layer 210 including an organic material. The first inorganic layer 261 can include one or more layers. For example, the first inorganic layer 261 including one or more layers can be provided under the first protection layer 210. For example, the first inorganic layer 261 can include silicon oxide or silicon nitride. For example, when the first inorganic layer 261 includes a plurality of layers, the first inorganic layer 261 can have a structure where silicon oxide and silicon nitride are alternately stacked.

In another embodiment of the present disclosure, the first inorganic layer 261 can be provided on a lowermost surface of the color filter film 200, and thus, the penetration of water into the color filter film 200 can be prevented and a yield rate can be enhanced.

Referring to FIG. 12, a color filter film 200 according to another embodiment of the present disclosure can further include a first inorganic layer 261 and a second inorganic layer 262. The first inorganic layer 261 can be the same as another embodiment of the present disclosure described above with reference to FIG. 11, and thus, only the second inorganic layer 262 will be described below.

The second inorganic layer 262 can be provided on an uppermost surface of the color filter film 200. The second inorganic layer 262 can be provided on a second protection layer 220. The second inorganic layer 262 can cover the second protection layer 220. The second inorganic layer 262 can contact an upper surface of the second protection layer 220. The second inorganic layer 262 can prevent the penetration of water into the second protection layer 220 including an organic material. For example, the second inorganic layer 262 can include one or more layers. For example, the second inorganic layer 262 including one or more layers can be provided on the second protection layer 220. For example, the second inorganic layer 262 can include silicon oxide or silicon nitride. For example, when the second inorganic layer 262 includes a plurality of layers, the second inorganic layer 262 can have a structure where silicon oxide and silicon nitride are alternately stacked.

In another embodiment of the present disclosure, the first inorganic layer 261 can be provided on a lowermost surface of the color filter film 200 and the second inorganic layer 262 can be provided on an uppermost surface of the color filter film 200, and thus, the penetration of water into the color filter film 200 can be prevented and a yield rate can be enhanced.

Figure 13:
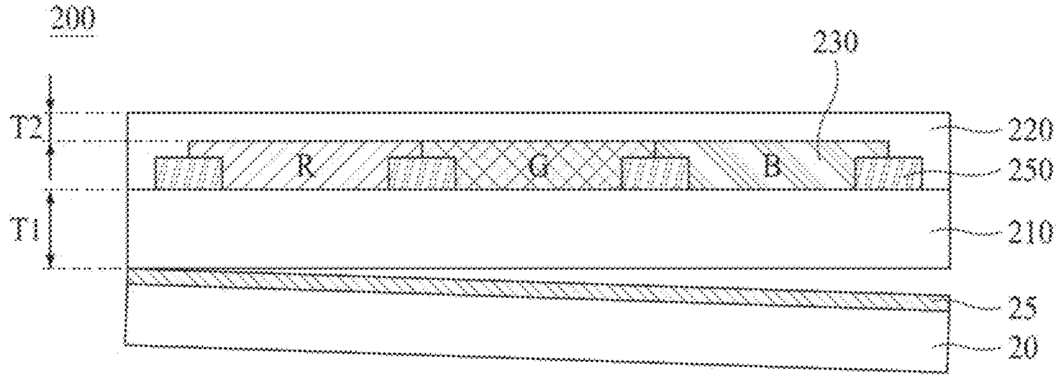
FIG. 13 is a cross-sectional view illustrating a color filter film according to another example of the present disclosure.
Figure 14:
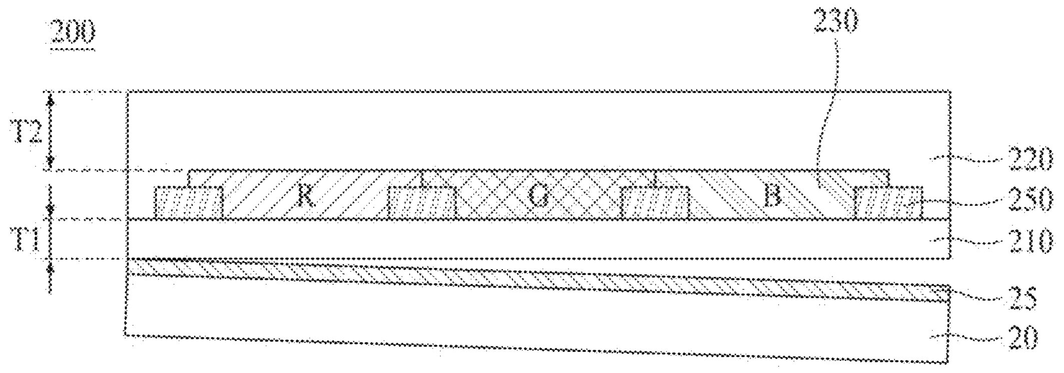
FIG. 14 is a cross-sectional view illustrating a color filter film according to another example of the present disclosure.

FIG. 13 is a cross-sectional view illustrating a color filter film according to another embodiment of the present disclosure. FIG. 14 is a cross-sectional view illustrating a color filter film according to another embodiment of the present disclosure. Except for a thickness of each of a first protection layer and a second protection layer, a color filter film according to another embodiment of the present disclosure can be the same as an embodiment of the present disclosure described above with reference to FIG. 5. Hereinafter, therefore, a thickness of each of a first protection layer and a second protection layer and elements relevant thereto will be described and repeated descriptions of the same elements are omitted or may be briefly provided.

A color filter film 200 applied to a display device according to an embodiment of the present disclosure can be applied to an inner folding structure or an outer folding structure, based on a bending direction of the display device. However, embodiments of the present disclosure are not limited thereto, and by appropriately adjusting a thickness of each of a first protection layer and a second protection layer, the color filter film 200 can be applied to a 360-degree folding structure to which all of inner folding and outer folding are applied. For example, the inner folding structure can be a structure where a pixel array layer and the color filter film 200 of a foldable display panel are disposed inward in a folding direction. For example, the outer folding structure can be a structure where the pixel array layer and the color filter film 200 of the foldable display panel are disposed outward in the folding direction.

Referring to FIG. 13, a color filter film 200 according to another embodiment of the present disclosure can include a first protection layer 210 and a second protection layer 220. For example, the first protection layer 210 and the second protection layer 220 of the color filter film 200 can have different thicknesses. For example, a thickness T2 of the second protection layer 220 can be thinner than a thickness T1 of the first protection layer 210. For example, the thickness T1 of the first protection layer 210 can be within a range of about 5 μm to about 10 μm. For example, the thickness T2 of the second protection layer 220 can be within a range of about 1 μm to about 3 μm.

Therefore, in another embodiment of the present disclosure, because the thickness T2 of the second protection layer 220 is thinner than the thickness T1 of the first protection layer 210, bending of a color filter film 200 and a display device can be easily performed in inner folding. Accordingly, in another embodiment of the present disclosure, in inner folding, a compression stress of the color filter film 200 can be reduced, and the occurrence of a crack or an interlayer stripping phenomenon can be prevented.

Referring to FIG. 14, a first protection layer 210 and a second protection layer 220 of a color filter film 200 according to another embodiment of the present disclosure can have different thicknesses. For example, a thickness T1 of the first protection layer 210 can be thinner than a thickness T2 of the second protection layer 220. For example, the thickness T1 of the first protection layer 210 can be within a range of about 1 μm to about 3 μm. For example, the thickness T2 of the second protection layer 220 can be within a range of about 5 μm to about 10 μm.

Therefore, in another embodiment of the present disclosure, because the thickness T1 of the first protection layer 210 is thinner than the thickness T2 of the second protection layer 220, bending of a color filter film 200 and a display device can be easily performed in outer folding. Accordingly, in another embodiment of the present disclosure, in outer folding, a tensile stress of the color filter film 200 can be reduced, and the occurrence of a crack or an interlayer stripping phenomenon can be prevented.

Figure 15A:
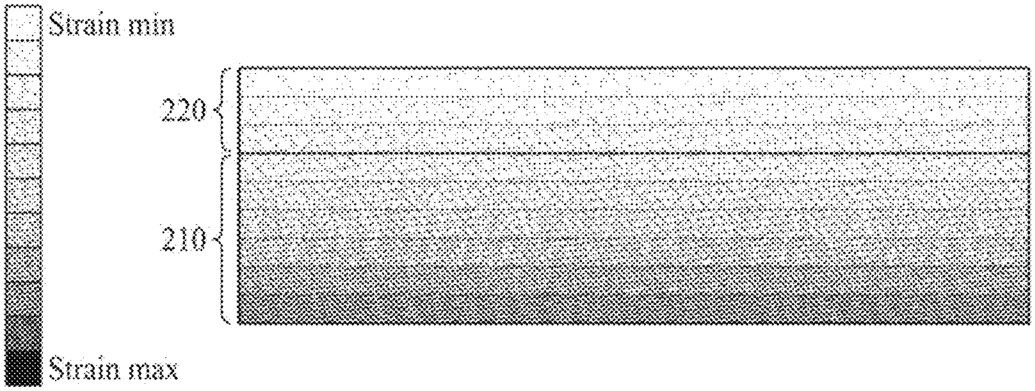
FIGS. 15A to 15C are graphs showing examples of a tensile strain with respect to a thickness of each of a first protection layer and a second protection layer according to an embodiment of the present disclosure.
Figure 15B:
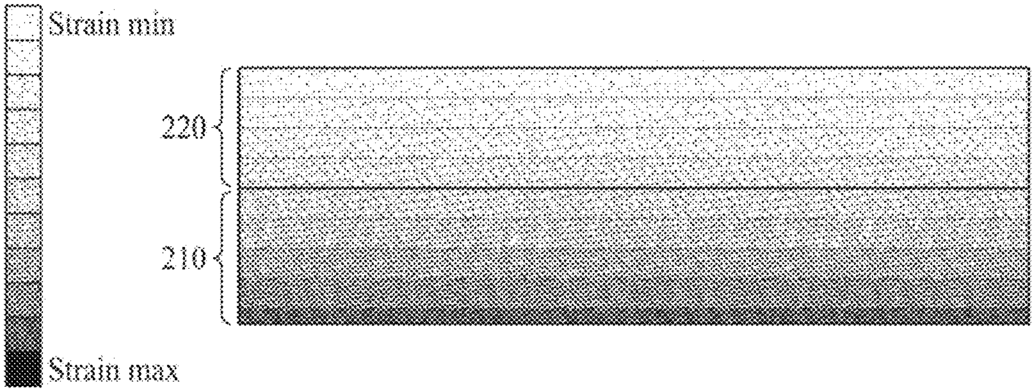
Figure 15C:
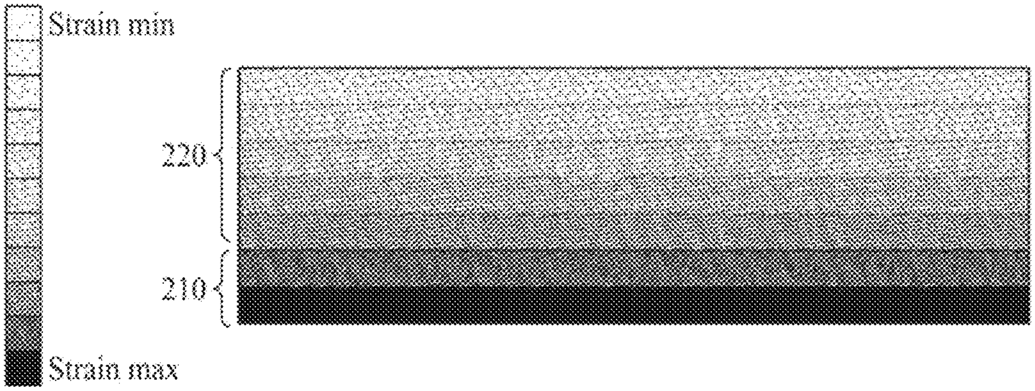

FIGS. 15A to 15C are graphs showing examples of a tensile strain with respect to a thickness of each of a first protection layer and a second protection layer according to an embodiment of the present disclosure.

The inventor has performed various experiments for optimizing a thickness of each of a first protection layer 210 and a second protection layer 220 of a color filter film 200 in a folding direction. The inventor has prepared samples as an embodiment 2, an embodiment 3, and an embodiment 4 so as to compare tensile strains based on the thicknesses of the first protection layer 210 and the second protection layer 220. Devices according to the embodiments 2 to 4 can include the supporting plate 300, the pixel array layer 160, the encapsulation layer 150, the touch sensing layer 180, and the color filter film 200 according to an embodiment of the present disclosure described above with reference to FIGS. 3 to 6. This can denote that a tensile strain increases progressively toward a dark color in a graph.

As in FIG. 15A, in the embodiment 2, it has been set that a thickness of a first protection layer 210 is about 7 μm and a thickness of a second protection layer 220 is about 3 μm, and thus, the thickness of the first protection layer 210 is thicker than that of the second protection layer 220. In the embodiment 2, it can be seen that a lower portion of the first protection layer 210 is higher in tensile strain than an upper portion of the second protection layer 220. A tensile strain of the upper portion of the second protection layer 220 represents a value of −2.742e-3, and a tensile strain of the lower portion of the first protection layer 210 represents a value of +2.095e-3.

As in FIG. 15B, in the embodiment 3, it has been set that a thickness of a first protection layer 210 is about 5 μm and a thickness of a second protection layer 220 is about 5 μm, and thus, the thickness of the first protection layer 210 is equal to that of the second protection layer 220. In the embodiment 3, it can be seen that a lower portion of the first protection layer 210 is higher in tensile strain than an upper portion of the second protection layer 220. A tensile strain of the upper portion of the second protection layer 220 represents a value of −2.418e-3, and a tensile strain of the lower portion of the first protection layer 210 represents a value of +2.415e-3.

As in FIG. 15C, in the embodiment 4, it has been set that a thickness of a first protection layer 210 is about 3 μm and a thickness of a second protection layer 220 is about 7 μm, and thus, the thickness of the second protection layer 220 is thicker than that of the first protection layer 210. In the embodiment 4, it can be seen that a lower portion of the first protection layer 210 is higher in tensile strain than an upper portion of the second protection layer 220. A tensile strain of the upper portion of the second protection layer 220 represents a value of −2.096e-3, and a tensile strain of the lower portion of the first protection layer 210 represents a value of +2.738e-3.

Referring to FIGS. 15A to 15C, a color filter film 200 according to an embodiment of the present disclosure can be applied under a condition where a thickness of the first protection layer 210 and a thickness of the second protection layer 220 are differently set, based on a folding direction. For example, in a case where the color filter film 200 is applied to an inner folding structure, the embodiment 2 can be applied where a value of a tensile strain of the lower portion of the first protection layer 210 is +2.095e-3 and is lowest. For example, in a case where the color filter film 200 is applied to the inner folding structure, the thickness of the second protection layer 220 can be set to be thinner than that of the first protection layer 210. In this case, in a simulation result, comparing with the embodiment 3 (or a case where the thickness of the second protection layer 220 is equal to that of the first protection layer 210), an effect has been obtained where a tensile strain of the first protection layer 210 decreases by about 13% or more. Further, comparing with the embodiment 4 (or a case where the thickness of the second protection layer 220 is thicker than that of the first protection layer 210), an effect has been obtained where a tensile strain of the first protection layer 210 decreases by about 23% or more.

Accordingly, according to an embodiment of the present disclosure, by appropriately adjusting a thickness of each of the first protection layer 210 and the second protection layer 220 of the color filter film 200, a tensile strain of the display device can decrease, and the occurrence of a crack or an interlayer stripping phenomenon can be prevented.

Figure 16A:
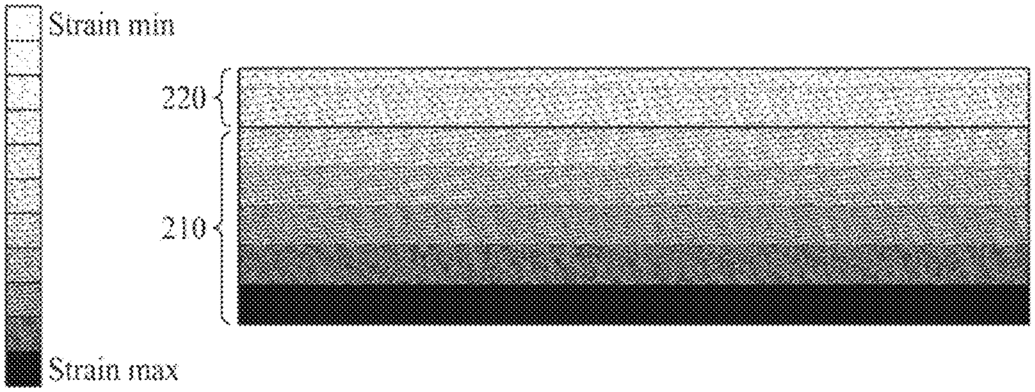
FIGS. 16A and 16B are graphs showing examples of a tensile strain with respect to materials of a first protection layer and a second protection layer according to an embodiment of the present disclosure.
Figure 16B:
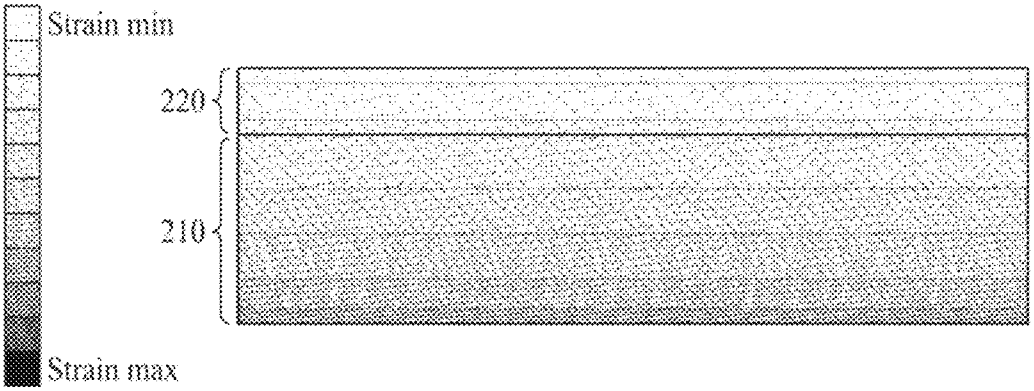

FIGS. 16A and 16B are graphs showing a tensile strain with respect to materials of a first protection layer and a second protection layer according to an embodiment of the present disclosure.

The inventor has performed various experiments for optimizing a material of each of the first protection layer 210 and the second protection layer 220 of the color filter film 200 based on a folding direction. The inventor has prepared samples as an embodiment 5 and an embodiment 6, so as to compare tensile strains based on the materials of the first protection layer 210 and the second protection layer 220. Devices according to the embodiments 5 and 6 can include the supporting plate 300, the pixel array layer 160, the encapsulation layer 150, the touch sensing layer 180, and the color filter film 200 according to an embodiment of the present disclosure described above with reference to FIGS. 3 to 6. In the embodiment 5 and the embodiment 6, it has been set that a thickness of a first protection layer 210 is about 7/m and a thickness of a second protection layer 220 is about 3 μm, and thus, the thickness of the first protection layer 210 is thicker than that of the second protection layer 220. This can denote that a tensile strain increases progressively toward a dark color in a graph.

As in FIG. 16A, in the embodiment 5, the first protection layer 210 and the second protection layer 220 have been manufactured by using materials having the same physical properties. For example, a Young's modulus of a material of the first protection layer 210 and a Young's modulus of a material of the second protection layer 220 are about 6.3 GPa and are equal to each other. According to a simulation result, in the embodiment 5, it can be seen that a lower portion of the first protection layer 210 is higher in tensile strain than an upper portion of the second protection layer 220. A tensile strain of the upper portion of the second protection layer 220 represents a value of −2.742e-3, and a tensile strain of the lower portion of the first protection layer 210 represents a value of +2.095e-3.

As in FIG. 16B, in the embodiment 6, the first protection layer 210 and the second protection layer 220 have been manufactured by using materials having different physical properties. For example, a Young's modulus of a material of the first protection layer 210 is about 6.3 GPa, and a Young's modulus of a material of the second protection layer 220 is about 3.5 GPa. According to a simulation result, in the embodiment 6, it can be seen that a lower portion of the first protection layer 210 is higher in tensile strain than an upper portion of the second protection layer 220. A tensile strain of the upper portion of the second protection layer 220 represents a value of −3.730e-3, and a tensile strain of the lower portion of the first protection layer 210 represents a value of +1.134e-3.

Referring to FIGS. 16A and 16B, in an embodiment of the present disclosure, in a case where the first protection layer 210 and the second protection layer 220 use materials having different physical properties and the Young's modulus of the material of the second protection layer 220 is 45% to 50% lower than the Young's modulus of the material of the first protection layer 210, a tensile strain of the first protection layer 210 has been reduced. Accordingly, in some embodiments of the present disclosure, the inventor has confirmed that a tensile strain is reduced and the occurrence of a crack or an interlayer stripping phenomenon of the display device is prevented.

Figure 17:
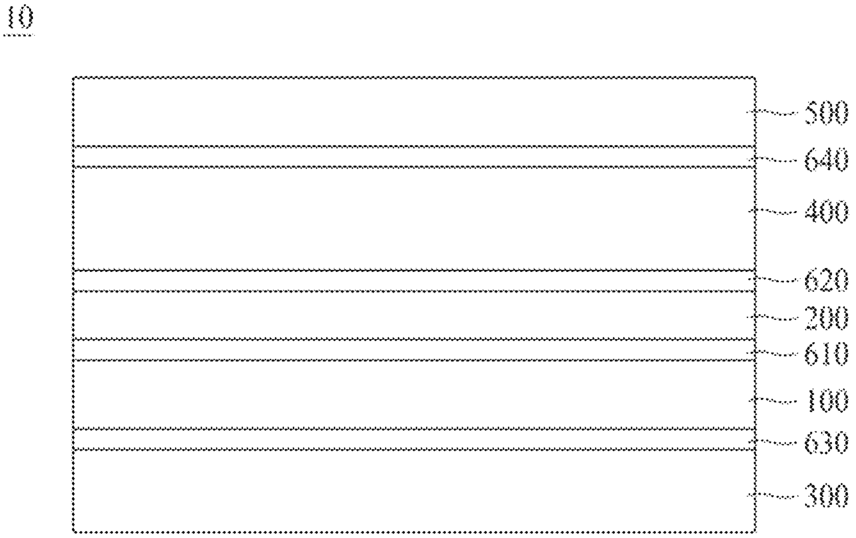
FIG. 17 is a cross-sectional view schematically illustrating a display device according to another example of the present disclosure.

FIG. 17 is a cross-sectional view schematically illustrating a display device according to another embodiment of the present disclosure. Except for that a reinforcement member 400 and a fourth adhesive member are additionally provided, a display device according to another embodiment of the present disclosure can be the same as an embodiment of the present disclosure described above with reference to FIG. 3. Hereinafter, therefore, a reinforcement member 400 and a fourth adhesive member and elements relevant thereto will be described and repeated descriptions of the same elements are omitted or may be briefly provided.

Referring to FIG. 17, a display device 10 according to another embodiment of the present disclosure can further include a reinforcement member 400 and a fourth adhesive member 640. The reinforcement member 400 and the fourth adhesive member 640 can be provided between a color filter film 200 and a cover member 500. The reinforcement member 400 can be attached on a second adhesive member 620 and can be provided on a color filter film 200. For example, the reinforcement member 400 can include a tempered glass.

The fourth adhesive member 640 can attach the reinforcement member 400 on the cover member 500. The fourth adhesive member 640 can attach an upper surface of the reinforcement member 400 on a lower surface of the cover member 500. For example, the fourth adhesive member 640 can be a transparent adhesive layer or a semitransparent adhesive layer having a transmittance of about 80% or more. For example, the fourth adhesive member 640 can include the same material as that of the first adhesive member described above with reference to FIG. 3.

In another embodiment of the present disclosure, because the reinforcement member 400 and the fourth adhesive member 640 are provided between the color filter film 200 and the cover member 500, an optical characteristic of the display device 10 can be more enhanced.

Figure 18:
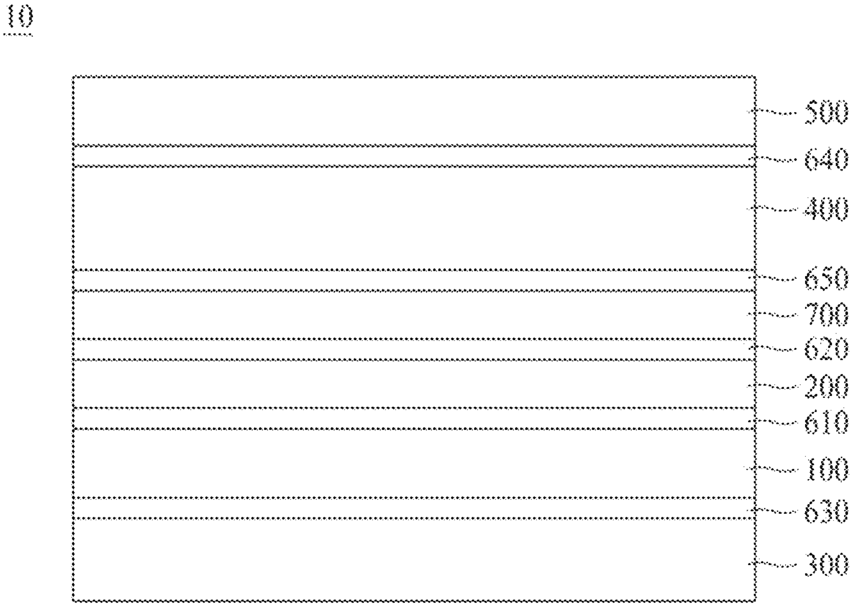
FIG. 18 is a cross-sectional view schematically illustrating a display device according to another example of the present disclosure.

FIG. 18 is a cross-sectional view schematically illustrating a display device according to another embodiment of the present disclosure. Except for that a stiffness complement film and a fifth adhesive member are additionally provided, a display device according to another embodiment of the present disclosure can be the same as another embodiment of the present disclosure described above with reference to FIG. 17. Hereinafter, therefore, a stiffness complement film and a fifth adhesive member and elements relevant thereto will be described and repeated descriptions of the same elements are omitted or may be briefly provided.

Referring to FIG. 18, a display device 10 according to another embodiment of the present disclosure can further include a stiffness complement film 700 and a fifth adhesive member 650.

The stiffness complement film 700 can be provided between a color filter film 200 and a reinforcement member 400. The stiffness complement film 700 can complement the stiffness of the display device 10 in bending. The stiffness complement film 700 can be attached on the color filter film 200 by a second adhesive member 620. The stiffness complement film 700 can be attached on a portion under the reinforcement member 400 by the fifth adhesive member 650. For example, the stiffness complement film 700 can be a polymer flexible film including polyimide (PI).

The fifth adhesive member 650 can be provided between the stiffness complement film 700 and the reinforcement member 400. The fifth adhesive member 650 can attach the stiffness complement film 700 on the reinforcement member 400. The fifth adhesive member 650 can attach an upper surface of the stiffness complement film 700 on a lower surface of the reinforcement member 400. For example, the fifth adhesive member 650 can be the same transparent adhesive layer as the fourth adhesive member 640, or can be a semitransparent adhesive layer having a transmittance of about 80% or more.

In another embodiment of the present disclosure, because the stiffness complement film 700 is provided between the color filter film 200 and the reinforcement member 400, the color filter film 200 can be protected, and the stiffness of the display device can be complemented.

Figure 19:
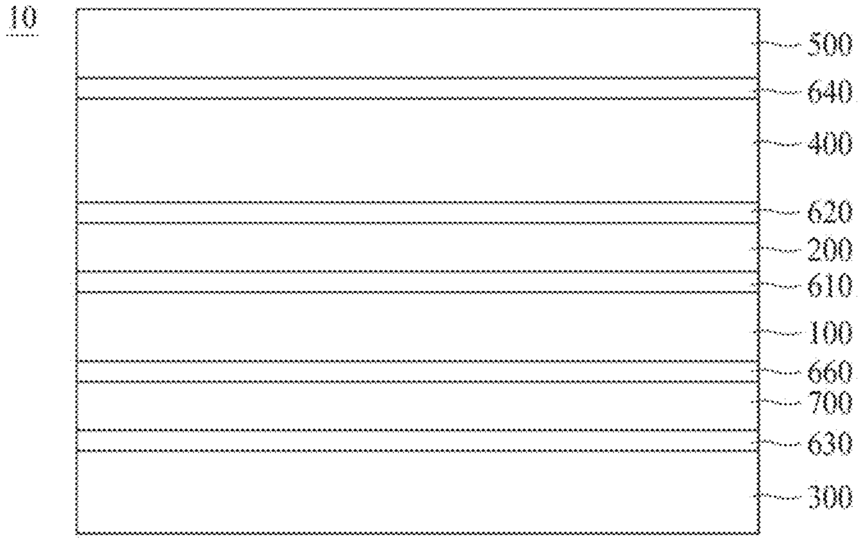
FIG. 19 is a cross-sectional view schematically illustrating a display device according to another example of the present disclosure.

FIG. 19 is a cross-sectional view schematically illustrating a display device according to another embodiment of the present disclosure. Except for that a stiffness complement film and a sixth adhesive member are additionally provided, a display device according to another embodiment of the present disclosure can be the same as another embodiment of the present disclosure described above with reference to FIG. 17. Hereinafter, therefore, a stiffness complement film and a sixth adhesive member and elements relevant thereto will be described and repeated descriptions of the same elements are omitted or may be briefly provided.

Referring to FIG. 19, a display device 10 according to another embodiment of the present disclosure can further include a stiffness complement film 700 and a sixth adhesive member 660.

The stiffness complement film 700 can be provided between a supporting plate 300 and a foldable display panel 100. The stiffness complement film 700 can complement the stiffness of the display device 10 in bending. The stiffness complement film 700 can be attached on the supporting plate 300 by a third adhesive member 630. The stiffness complement film 700 can be attached on a portion under the foldable display panel 100 by the sixth adhesive member 660. For example, the stiffness complement film 700 can be a polymer flexible film including polyimide (PI).

The third adhesive member 630 can be provided between the supporting plate 300 and the stiffness complement film 700. The third adhesive member 630 can attach the supporting plate 300 on the stiffness complement film 700. The third adhesive member 630 can attach an upper surface of the supporting plate 300 on a lower surface of the stiffness complement film 700. For example, the third adhesive member 630 can be a transparent adhesive layer, a semitransparent adhesive layer, or an opaque adhesive layer.

The sixth adhesive member 660 can be provided between the stiffness complement film 700 and the foldable display panel 100. The sixth adhesive member 660 can attach the stiffness complement film 700 on the foldable display panel 100. The sixth adhesive member 660 can attach the upper surface of the stiffness complement film 700 on a lower surface of the foldable display panel 100. For example, the sixth adhesive member 660 can be a transparent adhesive layer, a semitransparent adhesive layer, or an opaque adhesive layer. For example, the third adhesive member 630 and the sixth adhesive member 660 provided under the foldable display panel 100 may not transmit light, and thus, can be configured as a semitransparent or opaque adhesive layer which is not transparent.

In another embodiment of the present disclosure, because the stiffness complement film 700 is provided between the supporting plate 300 and the foldable display panel 100, the foldable display panel 100 can be additionally protected, and the stiffness of the display device can be complemented.

As in some embodiments of the present disclosure described above with reference to FIGS. 17 to 19, the color filter film 200 can be applied to the display device 10 having various stack structures. Further, the color filter film 200 according to some embodiments of the present disclosure can be manufactured separately from the foldable display panel 100, and thus, can be easily inserted into a desired layer and used.

Figure 20:
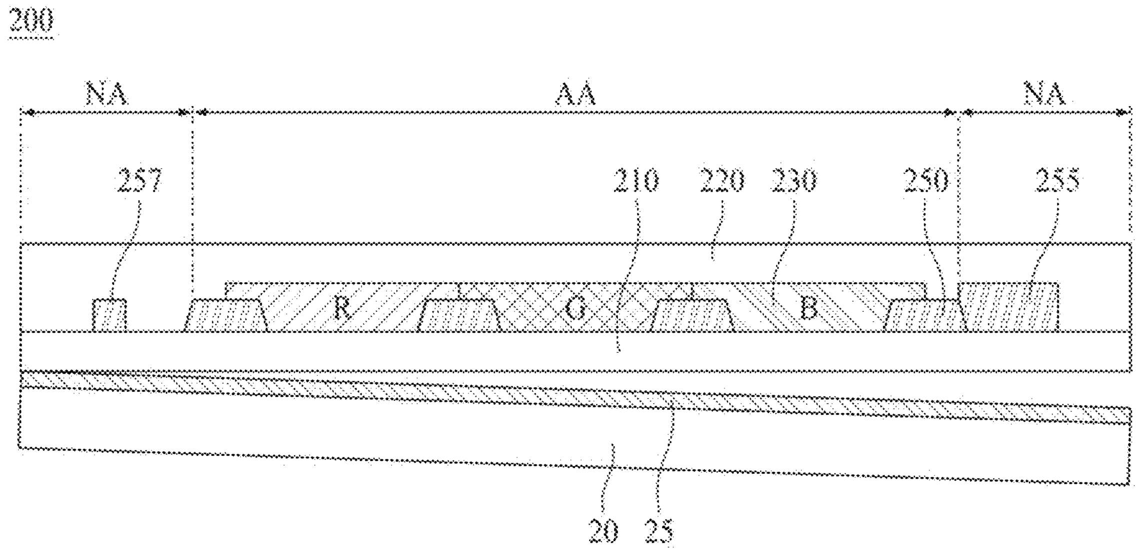
FIG. 20 is a cross-sectional view for describing an edge region of a color filter film according to an example of the present disclosure.

FIG. 20 is a cross-sectional view for describing an edge region of a color filter film according to an embodiment of the present disclosure.

Referring to FIG. 20, a color filter film 200 according to an embodiment of the present disclosure can be manufactured on a dummy substrate 20 by using a separate process. Therefore, a non-display area (or an edge area) NA of the color filter film 200 can be variously used.

For example, an align pattern 257 for adjusting a foldable display panel and the color filter film 200 can be provided in the non-display area NA of the color filter film 200 according to an embodiment of the present disclosure. For example, the non-display area NA can be an outer edge region, where the color filter layer 230 is not provided, of the color filter film 200. For example, the align pattern 257 can be provided on a first protection layer 210. The align pattern 257 can be provided on the same layer as a black matrix 250 and can be formed by using the same process. A second protection layer 220 can be provided on the align pattern 257 and can cover the align pattern 257. The second protection layer 220 can contact the align pattern 257.

Accordingly, in an embodiment of the present disclosure, without additionally performing a separate process, the align pattern 257 can be easily provided, and thus, the foldable display panel can be more easily attached on the color filter film 200.

For example, a dam 255 can be provided in the non-display area NA of the color filter film 200 according to an embodiment of the present disclosure. For example, the dam 255 can be provided on the first protection layer 210. The dam 255 can be provided on the same layer as the black matrix 250 and can be formed by using the same process. The dam 255 can have the same thickness as that of a color filter layer 230. However, embodiments of the present disclosure are not limited thereto, and the dam 255 and the color filter layer 230 can be formed to have a similar thickness within an error range of about 10%. The second protection layer 220 can be provided on the dam 255 and can cover the dam 255. The second protection layer 220 can contact the dam 255. Accordingly, a contact area between the second protection layer 220 and layers provided under the second protection layer 220 can increase, and an adhesive force can be enhanced.

Therefore, in an embodiment of the present disclosure, without additionally performing a separate process, the dam 255 can be provided, and the leakage of light in an outermost region of the color filter film 200 and the foldable display panel can be prevented. Further, in an embodiment of the present disclosure, the dam 255 and the color filter layer 230 can be provided to have similar thicknesses, and thus, the flatness of the color filter film 200 can be more enhanced, and adhesive properties corresponding to the second protection layer 220 can be more enhanced.

A color filter film and a display device including the same according to an embodiment of the present disclosure will be described below.

A color filter film according to an embodiment of the present disclosure can comprise a first protection layer, a color filter layer on the first protection layer, a black matrix dividing the color filter layer, and a second protection layer on the color filter layer and the black matrix.

According to some embodiments of the present disclosure, the first protection layer can comprise one of photoacryl (PAC), silicon-based elastomer, and thermoplastic polyurethane/thermal poly-urethane (TPU).

According to some embodiments of the present disclosure, the first protection layer and the second protection layer can comprise different materials.

According to some embodiments of the present disclosure, the second protection layer can cover the color filter layer and the black matrix.

According to some embodiments of the present disclosure, the first protection layer and the second protection layer can have different thicknesses.

According to some embodiments of the present disclosure, the color filter film can further comprise an adhesive member on the second protection layer.

According to some embodiments of the present disclosure, the black matrix can comprise a first black matrix on the first protection layer, and a second black matrix on the first black matrix, and a sum of thicknesses of the first black matrix and the second black matrix is less than or equal to a thickness of the color filter layer.

According to some embodiments of the present disclosure, the first black matrix can have a tapered shape, and the second black matrix has a reverse tapered shape.

According to some embodiments of the present disclosure, the black matrix can comprise a first black matrix on the first protection layer, and a second black matrix on the first black matrix, and a sum of thicknesses of the first black matrix and the second black matrix is greater than a thickness of the color filter layer.

According to some embodiments of the present disclosure, the color filter film can further comprise one or more inorganic layers under the first protection layer.

According to some embodiments of the present disclosure, the color filter film can further comprise one or more inorganic layers on the second protection layer.

A display device according to an embodiment of the present disclosure can comprise a foldable display panel including a bending region bent in a curved shape, a color filter film on the foldable display panel, and a cover member on the foldable display panel. The color filter film can comprise a first protection layer on the foldable display panel, a color filter layer on the first protection layer, a black matrix dividing the color filter layer, and a second protection layer on the color filter layer and the black matrix.

According to some embodiments of the present disclosure, the display device can further comprise a first adhesive member between the foldable display panel and the color filter film, and a second adhesive member between the color filter film and the cover member.

According to some embodiments of the present disclosure, the first protection layer can comprise one of photoacryl (PAC), silicon-based elastomer, and thermoplastic polyurethane or thermal poly-urethane (TPU).

According to some embodiments of the present disclosure, the color filter layer and the black matrix can be surrounded by the first protection layer and the second protection layer.

According to some embodiments of the present disclosure, the first protection layer and the second protection layer can have different thicknesses.

According to some embodiments of the present disclosure, the foldable display panel can comprise a thin film transistor on a substrate, an organic emission layer connected with the thin film transistor, an encapsulation layer on the organic emission layer, and a touch sensing layer on the encapsulation layer, and the first protection layer is provided on the touch sensing layer.

According to some embodiments of the present disclosure, the first adhesive member can be provided between the touch sensing layer and the first protection layer and attaches the touch sensing layer on the first protection layer, and the first adhesive member can comprise one of a transparent adhesive and a semitransparent adhesive.

According to some embodiments of the present disclosure, the second adhesive member can be provided between the color filter film and the cover member and attaches the color filter film on the cover member, and the second adhesive member can comprise one of a transparent adhesive and a semitransparent adhesive.

According to some embodiments of the present disclosure, the display device can further comprise a supporting plate provided under the foldable display panel and a third adhesive member attaching the foldable display panel on the supporting plate, and the third adhesive member can comprise one of a transparent adhesive, a semitransparent adhesive, and an opaque adhesive.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A color filter film comprising:
- a first protection layer;
- a color filter layer on the first protection layer;
- a black matrix dividing the color filter layer; and
- a second protection layer on the color filter layer and the black matrix, wherein the black matrix comprises:
- a first black matrix on the first protection layer; and
- a second black matrix on the first black matrix, and wherein the second black matrix is disposed on the color filter layer and contacts an upper surface of the first black matrix through an area between color filters of the color filter layer.

2. The color filter film of claim 1, wherein the first protection layer comprises one of photoacryl (PAC), silicon-based elastomer, and thermoplastic polyurethane or thermal poly-urethane (TPU).

3. The color filter film of claim 1, wherein the first protection layer and the second protection layer comprise different materials.

4. The color filter film of claim 1, wherein the second protection layer covers the color filter layer and the black matrix.

5. The color filter film of claim 1, wherein the first protection layer and the second protection layer have different thicknesses.

6. The color filter film of claim 1, further comprising an adhesive member on the second protection layer.

7. The color filter film of claim 1, wherein a sum of thicknesses of the first black matrix and the second black matrix is less than or equal to a thickness of the color filter layer.

8. The color filter film of claim 7, wherein the first black matrix has a tapered shape, and the second black matrix has a reverse tapered shape.

9. The color filter film of claim 1, wherein a sum of thicknesses of the first black matrix and the second black matrix is greater than a thickness of the color filter layer.

10. The color filter film of claim 1, further comprising one or more inorganic layers under the first protection layer.

11. The color filter film of claim 10, further comprising one or more inorganic layers on the second protection layer.

12. A display device comprising:

a foldable display panel including a bending region bent in a curved shape;

a color filter film on the foldable display panel; and a cover member on the foldable display panel, wherein the color filter film comprises:

a first protection layer on the foldable display panel, a color filter layer on the first protection layer, a black matrix dividing the color filter layer, and a second protection layer on the color filter layer and the black matrix, wherein the black matrix comprises:

a first black matrix on the first protection layer; and a second black matrix on the first black matrix, and wherein the second black matrix is disposed on the color filter layer and contacts an upper surface of the first black matrix through an area between color filters of the color filter layer.

13. The display device of claim 12, further comprising:

a first adhesive member between the foldable display panel and the color filter film; and a second adhesive member between the color filter film and the cover member.

14. The display device of claim 12, wherein the first protection layer comprises one of photoacryl (PAC), silicon-based elastomer, and thermoplastic polyurethane or thermal poly-urethane (TPU).

15. The display device of claim 12, wherein the color filter layer and the black matrix are surrounded by the first protection layer and the second protection layer.

16. The display device of claim 12, wherein the first protection layer and the second protection layer have different thicknesses.

17. The display device of claim 13, wherein the foldable display panel comprises:

a thin film transistor on a substrate;

an organic emission layer connected with the thin film transistor;

an encapsulation layer on the organic emission layer; and a touch sensing layer on the encapsulation layer, and wherein the first protection layer is provided on the touch sensing layer.

18. The display device of claim 17, wherein the first adhesive member is provided between the touch sensing layer and the first protection layer, and attaches the touch sensing layer on the first protection layer, and the first adhesive member comprises one of a transparent adhesive and a semitransparent adhesive.

19. The display device of claim 17, wherein the second adhesive member is provided between the color filter film and the cover member, and attaches the color filter film on the cover member, and the second adhesive member comprises one of a transparent adhesive and a semitransparent adhesive.

20. The display device of claim 12, further comprising:

a supporting plate provided under the foldable display panel; and a third adhesive member attaching the foldable display panel on the supporting plate, wherein the third adhesive member comprises one of a transparent adhesive, a semitransparent adhesive, and an opaque adhesive.

* * * * *